(12) United States Patent
Park et al.

(10) Patent No.: US 12,317,580 B2
(45) Date of Patent: May 27, 2025

(54) SEMICONDUCTOR DEVICE

(71) Applicant: SAMSUNG ELECTRONICS CO., LTD., Suwon-si (KR)

(72) Inventors: Sungil Park, Suwon-si (KR); Jaehyun Park, Hwaseong-si (KR); Hyo-Jin Kim, Bucheon-si (KR); Hyojin Kim, Seoul (KR); Daewon Ha, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 450 days.

(21) Appl. No.: 17/830,884

(22) Filed: Jun. 2, 2022

(65) Prior Publication Data
US 2023/0074880 A1  Mar. 9, 2023

(30) Foreign Application Priority Data
Sep. 8, 2021 (KR) .......... 10-2021-0119626

(51) Int. Cl.
*H01L 27/06* (2006.01)
*H01L 21/02* (2006.01)
(Continued)

(52) U.S. Cl.
CPC ....... *H10D 84/40* (2025.01); *H01L 21/02603* (2013.01); *H10D 10/061* (2025.01);
(Continued)

(58) Field of Classification Search
CPC .......... H01L 27/0623; H01L 21/02603; H01L 21/8249; H01L 29/0673; H01L 29/0847; H01L 29/41708; H01L 29/42304; H01L 29/42392; H01L 29/6625; H01L 29/66439; H01L 29/66545; H01L 29/66742; H01L 29/735; H01L 29/775; H01L 29/78696; H01L 29/0692; H01L 29/41766;
(Continued)

(56) References Cited

U.S. PATENT DOCUMENTS 9,209,095 B2 * 12/2015 Chang .................... H01L 29/165
9,978,745 B2 *  5/2018 Wang ..................... H10D 89/10
(Continued)

*Primary Examiner* — Eduardo A Rodela
(74) *Attorney, Agent, or Firm* — Muir Patent Law, PLLC

(57) ABSTRACT

A semiconductor device includes a first device including first active regions and first to third structures thereon, and a second device including a second active region, a gate structure intersecting the second active region, and a source/drain region including a lower source/drain region on the second active region having first-type conductivity, an inter-source/drain region insulating layer on the lower source/drain region, and an upper source/drain region on the inter-source/drain region insulating layer and having second-type conductivity. The first structure includes first lower and upper impurity regions. The second structure includes a second lower impurity region having the first-type conductivity, an inter-impurity region insulating layer, and a second upper impurity region having the second-type conductivity. The third structure includes third lower and upper impurity regions having the second-type conductivity, the third upper impurity region having an impurity concentration higher than a that of the third lower impurity region.

20 Claims, 29 Drawing Sheets

(51) Int. Cl.
*H10D 10/01* (2025.01)
*H10D 10/60* (2025.01)
*H10D 30/01* (2025.01)
*H10D 30/43* (2025.01)
*H10D 30/67* (2025.01)
*H10D 62/10* (2025.01)
*H10D 62/13* (2025.01)
*H10D 64/01* (2025.01)
*H10D 64/23* (2025.01)
*H10D 64/27* (2025.01)
*H10D 84/01* (2025.01)
*H10D 84/03* (2025.01)
*H10D 84/40* (2025.01)

(52) U.S. Cl.
CPC ........... *H10D 10/60* (2025.01); *H10D 30/014* (2025.01); *H10D 30/031* (2025.01); *H10D 30/43* (2025.01); *H10D 30/6735* (2025.01); *H10D 30/6757* (2025.01); *H10D 62/121* (2025.01); *H10D 62/151* (2025.01); *H10D 64/017* (2025.01); *H10D 64/231* (2025.01); *H10D 64/281* (2025.01); *H10D 84/0109* (2025.01); *H10D 84/038* (2025.01); *H10D 84/401* (2025.01)

(58) Field of Classification Search
CPC ............. H01L 27/0886; H01L 27/0711; H01L 27/0688; H01L 27/0924; B82Y 10/00; H10D 84/40; H10D 84/401
See application file for complete search history.

(56) References Cited

U.S. PATENT DOCUMENTS

| | | | |
|---|---|---|---|
| 10,217,853 B1* | 2/2019 | Pan | H01L 21/2253 |
| 10,256,158 B1 | 4/2019 | Frougier et al. | |
| 10,269,790 B2 | 4/2019 | Cheng et al. | |
| 10,522,419 B2 | 12/2019 | Ando et al. | |
| 10,930,569 B2* | 2/2021 | Chiang | H10D 86/215 |
| 11,257,817 B2* | 2/2022 | Su | H10D 62/151 |
| 11,508,718 B2* | 11/2022 | Kim | H01L 21/823493 |
| 11,824,116 B2* | 11/2023 | Guha | H10D 30/62 |
| 11,843,044 B2* | 12/2023 | Yu | H01L 27/0623 |
| 11,888,031 B2* | 1/2024 | Yu | H10D 10/021 |
| 11,967,637 B2* | 4/2024 | Razavieh | H10D 10/60 |
| 2017/0062564 A1* | 3/2017 | Zhou | H10D 62/124 |
| 2018/0261593 A1 | 9/2018 | Cheng et al. | |
| 2019/0229021 A1 | 7/2019 | Ando et al. | |
| 2020/0035786 A1 | 1/2020 | Xie et al. | |
| 2020/0258881 A1 | 8/2020 | Lilak et al. | |
| 2020/0294969 A1 | 9/2020 | Rachmady et al. | |
| 2021/0296309 A1* | 9/2021 | Chang | H01L 29/6625 |

* cited by examiner

SEMICONDUCTOR DEVICE

CROSS TO REFERENCE TO RELATED APPLICATION

This application claims benefit of priority to Korean Patent Application No. 10-2021-0119626 filed on Sep. 8, 2021, in the Korean Intellectual Property Office, the disclosure of which is incorporated herein by reference in its entirety.

BACKGROUND

1. Field

Embodiments relate to a semiconductor device.

2. Description of the Related Art

As demand for high performance, high speed, and/or multifunctionality of semiconductor devices has increased, integration density of a semiconductor device has increased. In manufacturing a semiconductor device having a fine pattern for high integration density of a semiconductor device, it may be important to implement patterns having a fine width or a fine spacing. Also, to address changes in operating properties due to a reduced size of a planar metal oxide semiconductor FET (MOSFET), a semiconductor device including a FinFET having a three-dimensional channel structure may be considered.

SUMMARY

According to an embodiment, a semiconductor device includes a first device including first active regions spaced apart from each other on a substrate, and a first structure, a second structure, and a third structure on each of the first active regions, and a second device including a second active region spaced apart from the first active regions on the substrate and extending in a first direction parallel to an upper surface of the substrate, at least one gate structure intersecting the second active region and extending in a second direction, and a source/drain region including a lower source/drain region on the second active region on at least one side of the gate structure and having first-type conductivity, an inter-source/drain region insulating layer on the lower source/drain region, and an upper source/drain region on the inter-source/drain region insulating layer having second-type conductivity different from the first-type conductivity, wherein the first structure includes a first lower impurity region and a first upper impurity region on the first lower impurity region, wherein the second structure includes a second lower impurity region having the first-type conductivity, an inter-impurity region insulating layer on the second lower impurity region, and a second upper impurity region on the inter-impurity region insulating layer and having the second-type conductivity, and wherein the third structure includes a third lower impurity region having the second-type conductivity and a third upper impurity region on the third lower impurity region having the second-type conductivity and having an impurity concentration higher than an impurity concentration of the third lower impurity region.

According to an embodiment, a semiconductor device includes a first device including a first structure, a second structure, and a third structure spaced apart from each other on a substrate, a second device including an active region extending in a first direction parallel to an upper surface of the substrate, at least one gate structure intersecting the active region and extending in a second direction, and a source/drain region including a lower source/drain region on the active region on at least one side of the gate structure and having first-type conductivity, an inter-source/drain region insulating layer on the lower source/drain region, and an upper source/drain region on the inter-source/drain region insulating layer having second-type conductivity different from the first-type conductivity, wherein the first structure includes a first lower impurity region having the second-type conductivity and a first upper impurity region on the first lower impurity region having the second-type conductivity and having an impurity concentration higher than an impurity concentration of the first lower impurity region, wherein the second structure includes a second lower impurity region having the first-type conductivity, an inter-impurity region insulating layer on the second lower impurity region, and a second upper impurity region on the inter-impurity region insulating layer and having the second-type conductivity, and wherein the third structure includes a third lower impurity region having the second-type conductivity and a third upper impurity region on the third lower impurity region and having the second-type conductivity.

According to an embodiment, a semiconductor device includes a first device including a first structure, a second structure, and a third structure spaced apart from each other on a substrate, a second device including an active region extending in a first direction parallel to an upper surface of the substrate, at least one gate structure intersecting the active region and extending in a second direction, a source/drain region including a lower source/drain region on the active region on at least one side of the gate structure and having first-type conductivity, an inter-source/drain region insulating layer on the lower source/drain region, and an upper source/drain region on the inter-source/drain region insulating layer and having second-type conductivity different from the first-type conductivity, wherein the first structure includes a first lower impurity region having the first-type conductivity and a first upper impurity region on the first lower impurity region and having the first-type conductivity, wherein the second structure includes a second lower impurity region having a stack structure of first and second semiconductor layers alternately stacked and having the second-type conductivity, and a second upper impurity region including a third semiconductor layer on the second lower impurity region and having the second-type conductivity, wherein the first semiconductor layers are first material layers, wherein the second semiconductor layers are second material layers different from the first material layers, wherein the third semiconductor layer is a third material layer different from at least one of the first and second material layers, wherein a thickness of the third material layer is greater than a thickness of each of the first and second material layers, and wherein the third structure includes a third lower impurity region having the first-type conductivity, an inter-impurity region insulating layer on the third lower impurity region, and a third upper impurity region on the inter-impurity region insulating layer and having the second-type conductivity.

BRIEF DESCRIPTION OF DRAWINGS

Features will become apparent to those of skill in the art by describing in detail example embodiments with reference to the attached drawings in which.

DETAILED DESCRIPTION

Figure 1A:
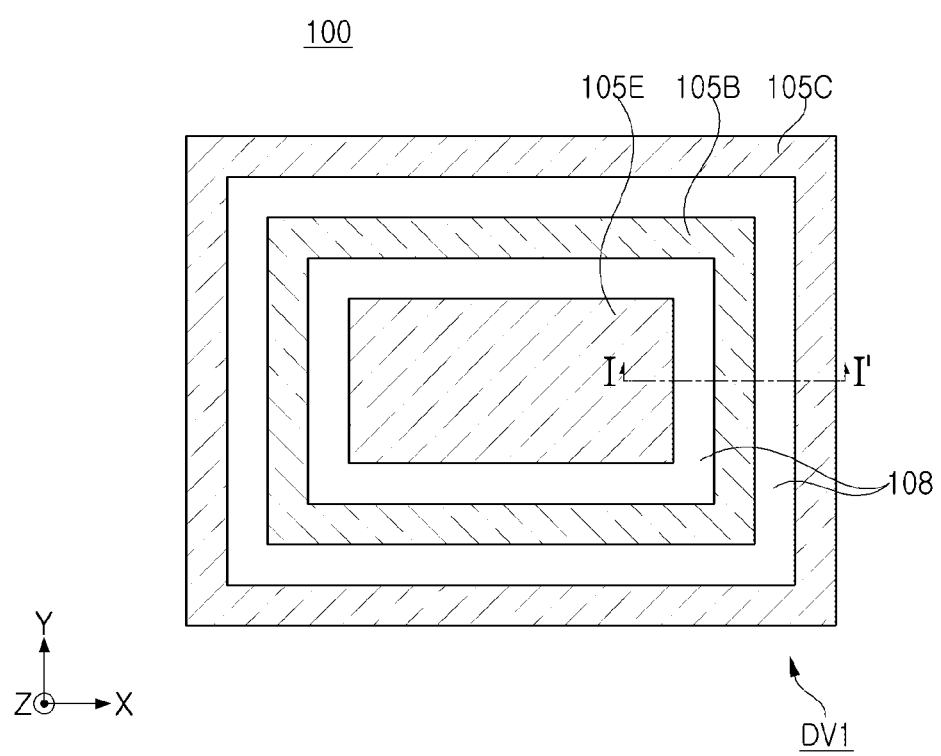
FIGS. 1A and 1B are plan diagrams illustrating a semiconductor device according to an example embodiment.
Figure 1B:
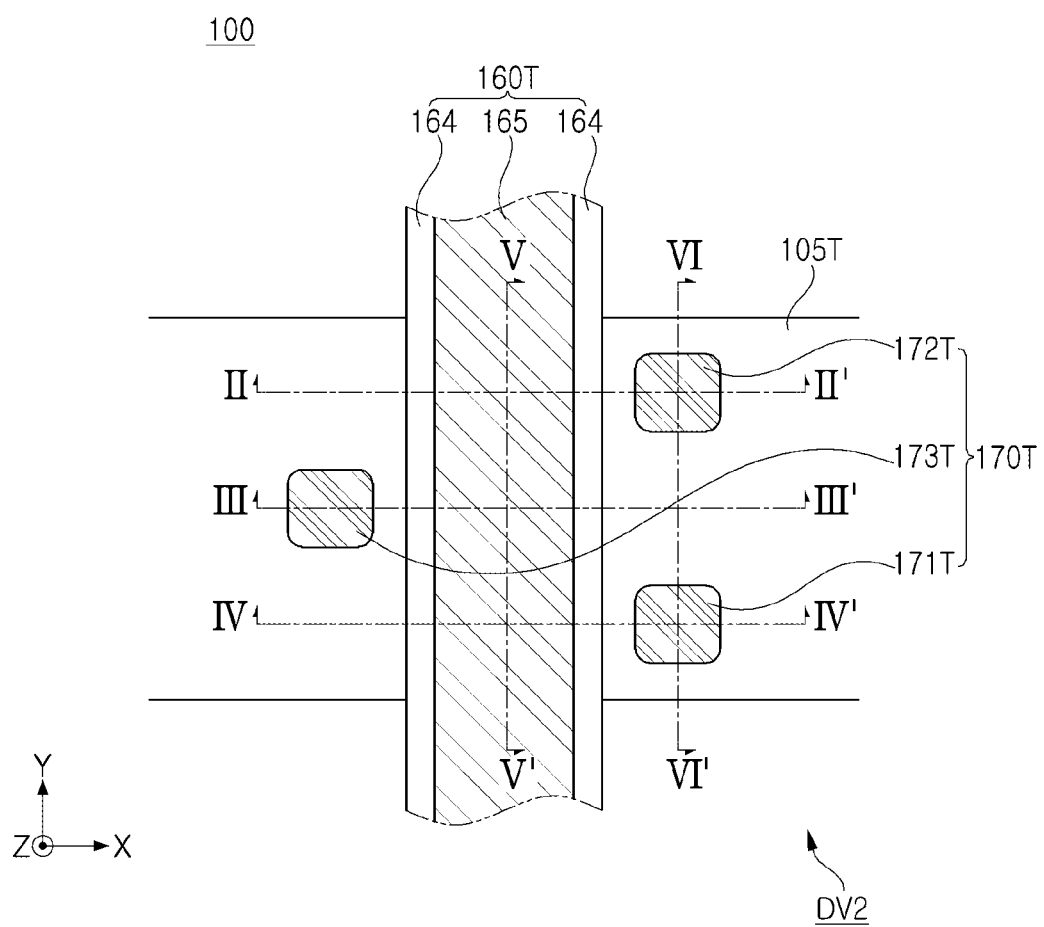
Figure 2:
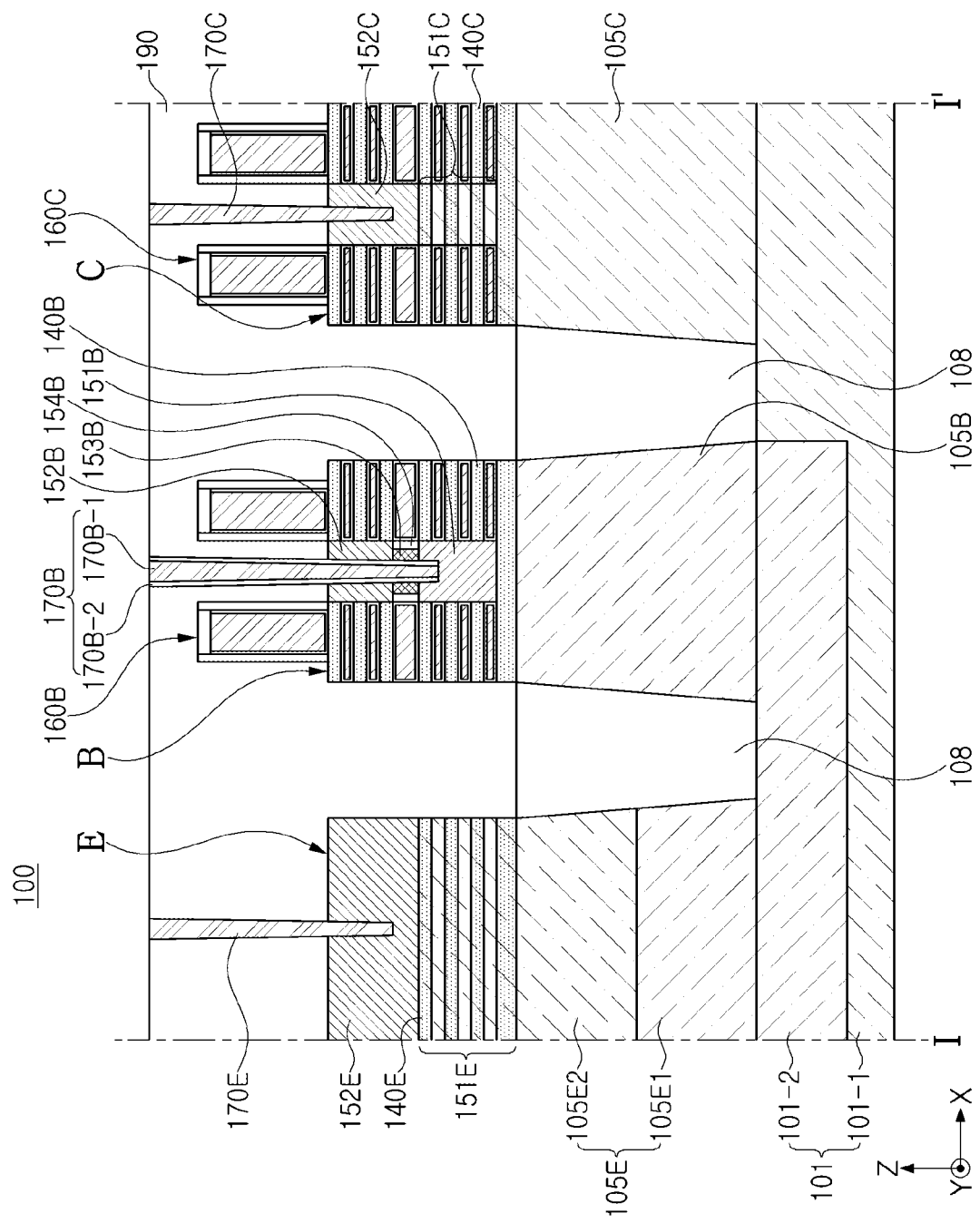
FIGS. 2 to 3E are cross-sectional diagrams illustrating a semiconductor device according to an example embodiment.
Figure 3A:
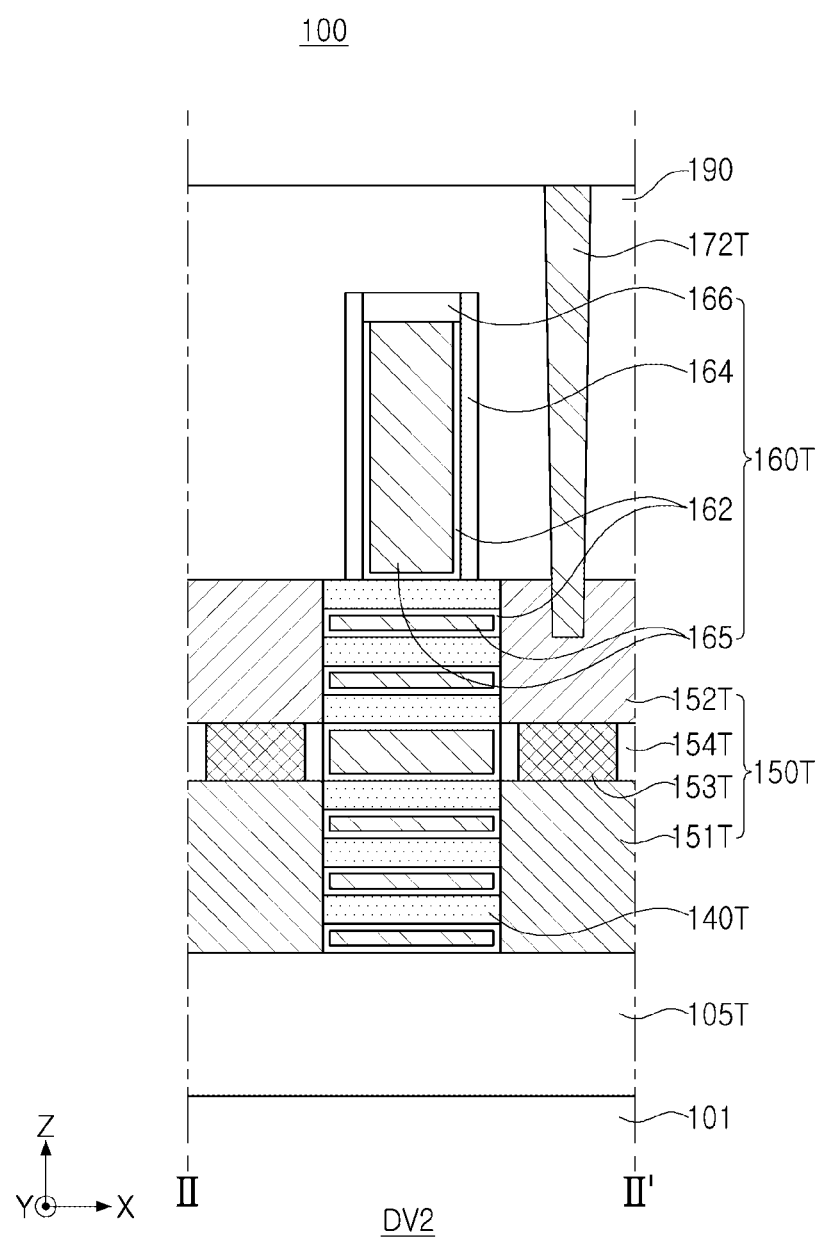
Figure 3B:
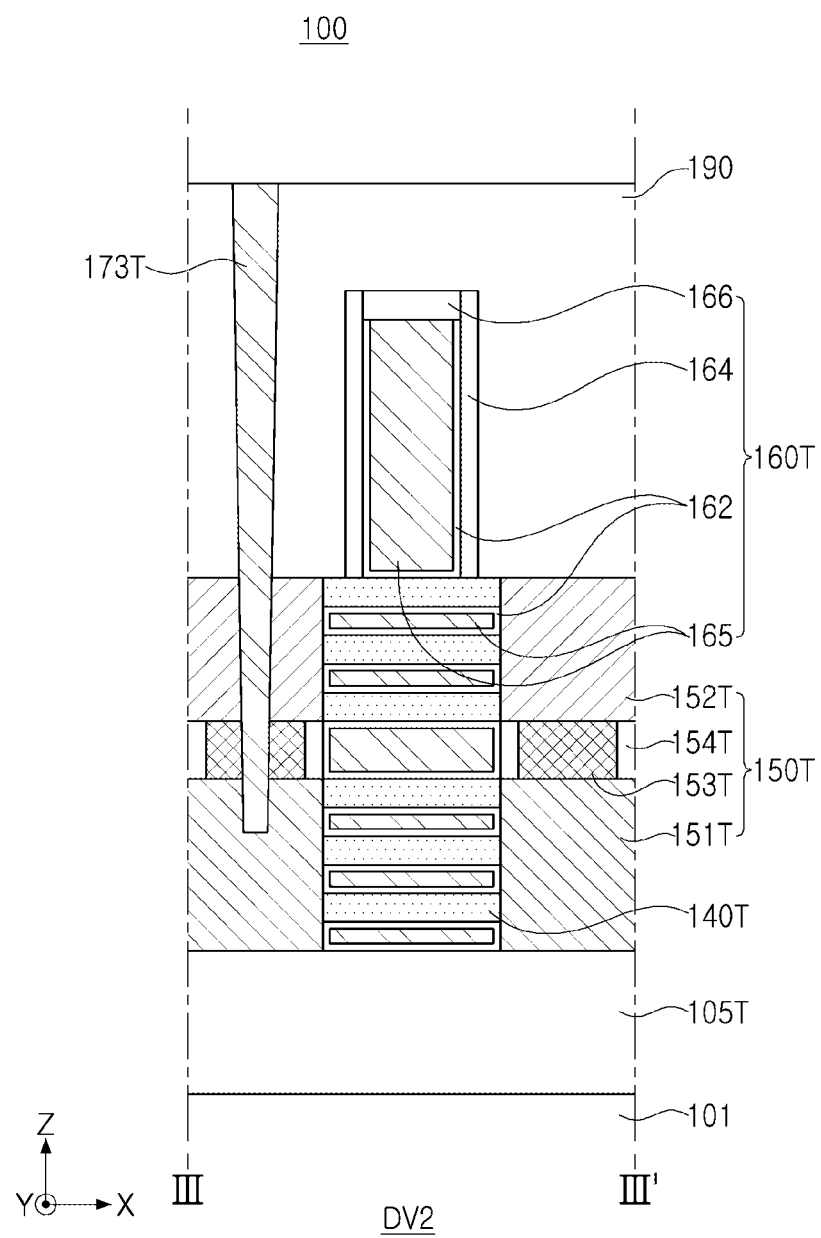
Figure 3C:
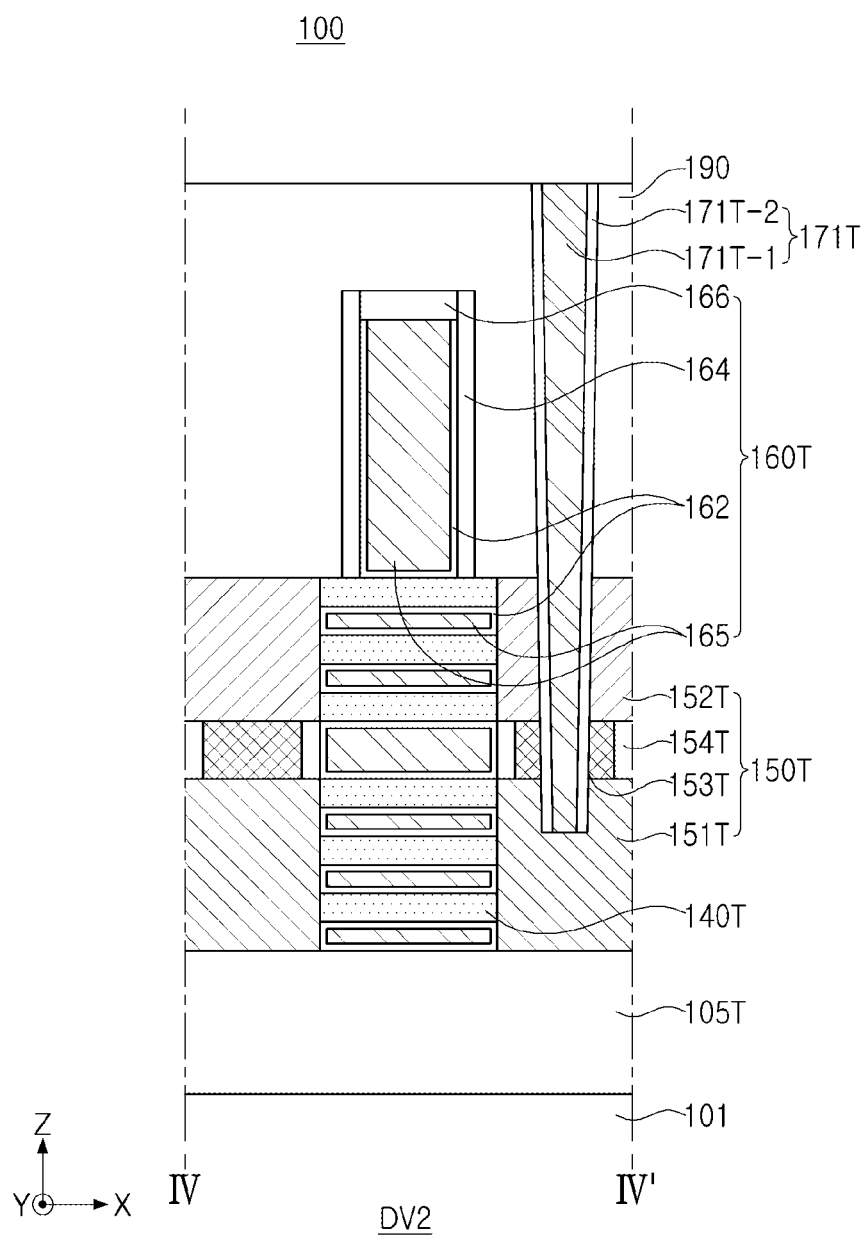
Figure 3D:
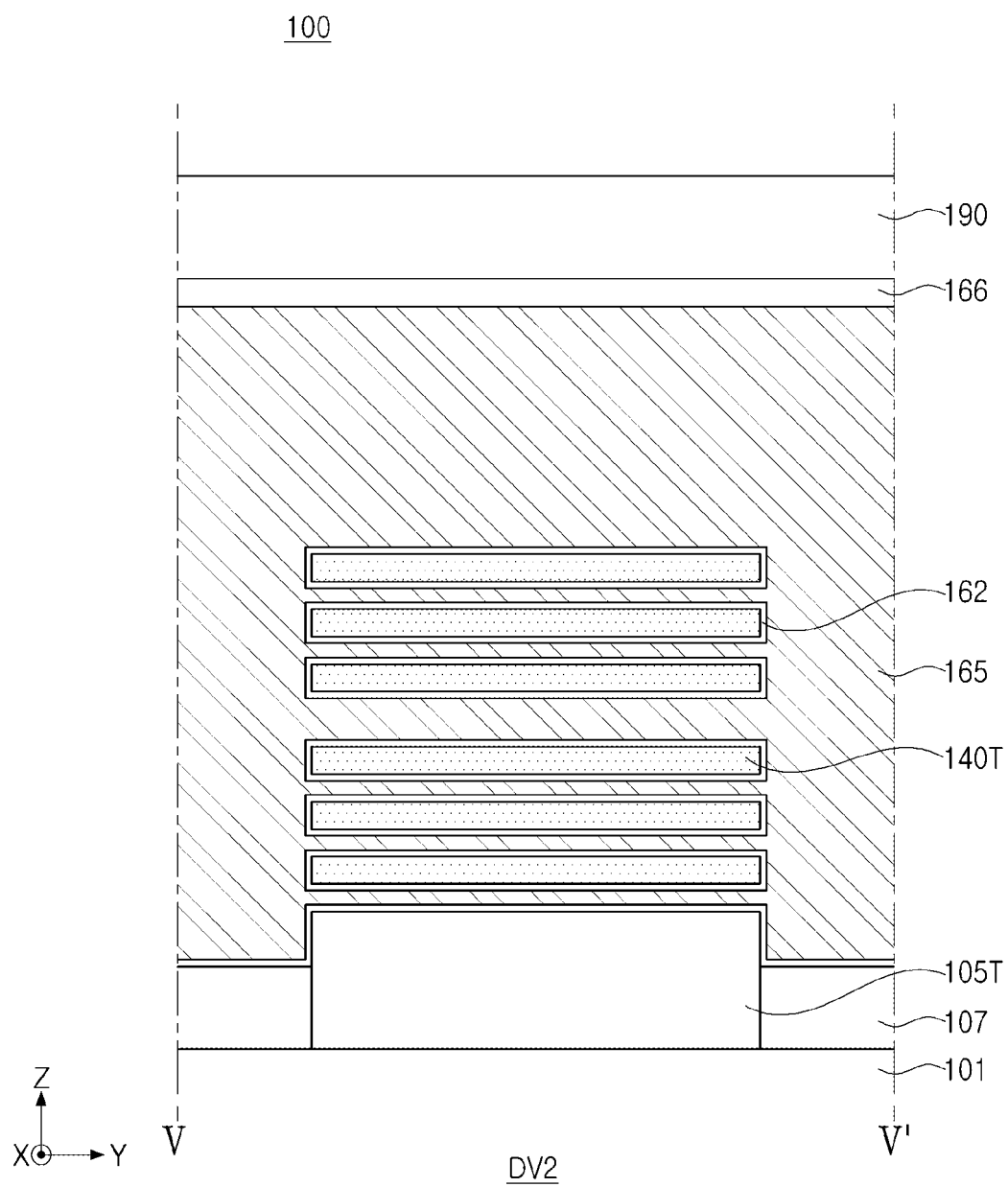
Figure 3E:
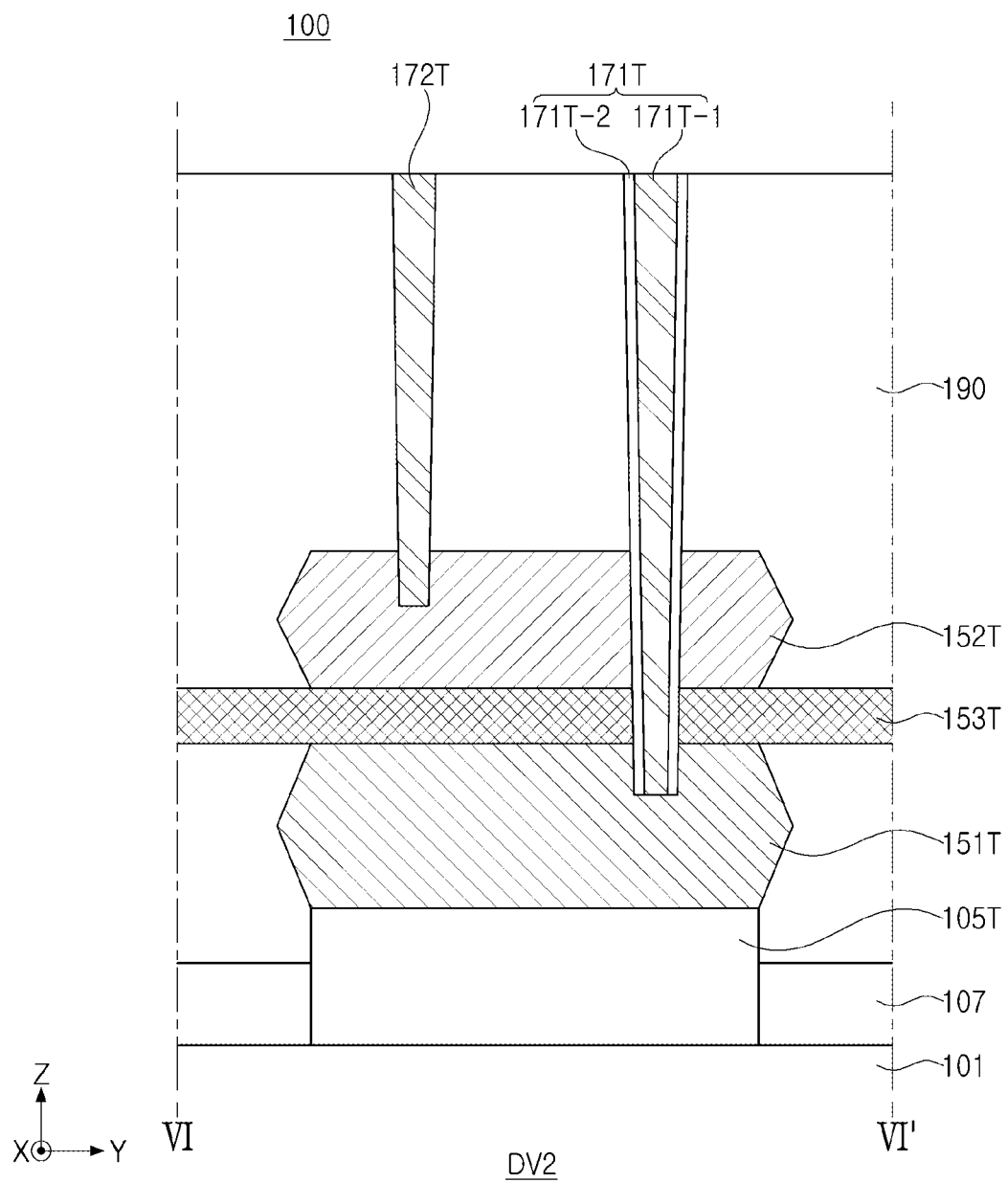

FIGS. 1A and 1B are plan diagrams illustrating a semiconductor device 100 according to an example embodiment. FIGS. 2 to 3E are cross-sectional diagrams illustrating a semiconductor device 100 according to an example embodiment. FIG. 2 is a cross-sectional diagram illustrating a semiconductor device 100 in FIG. 1A taken along I-I', FIG. 3A is a cross-sectional diagram illustrating a semiconductor device 100 in FIG. 1B taken along 3B is a cross-sectional diagram illustrating a semiconductor device 100 in FIG. 1B taken along line FIG. 3C is a cross-sectional diagram illustrating a semiconductor device 100 in FIG. 1B taken along line IV-IV', FIG. 3D is a cross-sectional diagram illustrating a semiconductor device 100 in FIG. 1B taken along line V-V', and FIG. 3E is a cross-sectional diagram illustrating a semiconductor device 100 in FIG. 1B taken along line VI-VI'. For ease of description, only main components of the semiconductor device are illustrated in FIGS. 1A to 3E.

Referring to FIGS. 1A to 3E, the semiconductor device 100 may include a first device DV1 and a second device DV2 spaced apart from the first device DV1.

Referring to FIGS. 1A and 2, the first device DV1 may include a substrate 101, first active regions 105E, 105B, and 105C on the substrate 101, isolation insulating layers 108, a first structure E, a second structure B, a third structure C, first contact plugs 170E, 170B, and 170C, and an interlayer insulating layer 190. The first structure E, the second structure B, and the third structure C may be spaced apart from each other. The first structure E may include a first lower impurity region 151E and a first upper impurity region 152E. The second structure B may include a second lower impurity region 151B, a second upper impurity region 152B, and an inter-impurity region insulating layer 153B. The third structure C may include a third lower impurity region 151C and a third upper impurity region 152C.

The first device DV1 may be configured as a bipolar junction transistor (BJT) including the first structure E working as an emitter, the second structure B working as a base, and the third structure C working as a collector. The first device DV1 may be a PNP device or an NPN device. The example embodiments may be described with reference to a PNP device, but the example embodiments may be implemented in an NPN device.

Referring to FIGS. 1B and 3A to 3E, the second device DV2 may include the substrate 101, second active regions 105T on the substrate 101, device isolation layers 107 isolating the second active regions 105T, channel layers 140T on the second active regions 105T, source/drain regions 150T in contact with the channel layers 140T, gate structures 160T extending to intersect the second active regions 105T, second contact plugs 170T, and an interlayer insulating layer 190. Each of the source/drain regions 150T may include a lower source/drain region 151T, an upper source/drain region 152T, and an inter-source/drain region insulating layer 153T. Each of the gate structures 160T may include a gate dielectric layer 162, a gate electrode 165, a spacer structure 164, and a capping layer 166.

In the second device DV2, the second active regions 105T may have a fin structure, and the gate electrode 165 may be disposed between the second active regions 105T and the channel layers 140T, between the channel layers 140T, and on the uppermost surface of channel layers 140T. Thus, the second device DV2 of the semiconductor device 100 may include a gate-all-around type field effect transistor using the channel layers 140T, the source/drain regions 150T, and the gate structures 160T.

The substrate 101 may have an upper surface extending in the X-direction and the Y-direction. The substrate 101 may include a semiconductor material, e.g., a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, an epitaxial layer, a silicon on insulator (SOI) layer, or a semiconductor on insulator (SeOI) layer.

The first active regions 105E, 105B, and 105C may respectively correspond to an emitter active region 105E, a base active region 105B, and a collector active region 105C. The first active regions 105E, 105B, and 105C may protrude from the upper surface of the substrate 101 in the vertical Z-direction. The first active regions 105E, 105B, and 105C may be formed as a portion of the substrate 101. The first active regions 105E, 105B, and 105C may include a doped region. A lower emitter active region 105E1 of the emitter active region 105E may be doped to have a first-type conductivity. An upper emitter active region 105E2 of the emitter active region 105E may be doped to have a second-type conductivity, different from the first-type conductivity. The base active region 105B may be doped to have the first-type conductivity. The collector active region 105C may be doped to have the second-type conductivity. For example, the upper emitter active region 105E2 of the emitter active region 105E and the collector active region 105C may have P-type conductivity, and the lower emitter active region 105E1 of the emitter active region 105E and the base active region 105B may have N-type conductivity. In another implementation, the elements may be doped with a combination of different types of conductivity. The first active regions 105E, 105B, and 105C may be spaced apart from each other on the substrate 101. The base active region 105B may be arranged to surround the emitter active region 105E and to be isolated by the isolation insulating layers 108 on a plane. The collector active region 105C may be arranged to surround the base active region 105B and to be isolated by the isolation insulating layers 108.

The second active regions 105T may extend in a direction parallel to the upper surface of the substrate 101, e.g., in the X-direction. The second active regions 105T may be spaced apart from each other in the Y-direction and may be disposed in parallel to each other. The second active regions 105T may protrude from the upper surface of the substrate 101 in the vertical Z-direction. Upper ends of the second active regions 105T may protrude from the upper surface of the device isolation layers 107 by a predetermined height. The second active regions 105T may be formed as a portion of the substrate 101, or may include an epitaxial layer grown from the substrate 101. However, the second active regions 105T on the substrate 101 may be partially recessed on both sides of the gate structures 160T, and the source/drain regions 150T may be on the recessed second active regions 105T.

The first active regions 105E, 105B, and 105C and the second active regions 105T may be spaced apart from each other. The first active regions 105E, 105B, and 105C and the second active regions 105T may be formed as a trench by the same process. The first active regions 105E, 105B, and 105C and the second active regions 105T may be formed by separate processes.

The device isolation layers 107 may define the second active regions 105T. The device isolation layers 107 may be disposed between the second active regions 105T. The device isolation layers 107 may have upper portions on a level lower than upper portions of the second active regions 105T. Thus, the device isolation layers 107 may partially expose the upper portions of the second active regions 105T. The device isolation layers 107 may have a curved upper surface having a level increasing toward the second active regions 105T. The device isolation layers 107 may be formed by, e.g., a shallow trench isolation (STI) process. The device isolation layers 107 may be formed of an insulating material. The device isolation layers 107 may be, e.g., oxide, nitride, or a combination thereof.

The isolation insulating layers 108 may define the first active regions 105E, 105B, and 105C. The isolation insulating layers 108 may be disposed between the first active regions 105E, 105B, and 105C. The isolation insulating layers 108 may be formed more deeply than the device isolation layers 107. The isolation insulating layers 108 may be formed of an insulating material. The isolation insulating layers 108 may be, e.g., oxide, nitride, or a combination thereof. The isolation insulating layers 108 may include the same material as that of the device isolation layers 107.

The channel layers 140T may be stacked on the second active regions 105T and may be spaced apart from each other in the Z-direction perpendicular to the substrate 101. The channel layers 140T may be connected to the source/drain regions 150T. The channel layers 140T may have a width the same as or similar to a width of the second active regions 105T in the Y-direction, and may have a width the same as or similar to a width of the gate structures 160T in the X-direction. The channel layers 140T may include first lower channel layers and first upper channel layers. The lower three channel layers of the channel layers 140T may form the first lower channel layers. The upper three channel layers may form the first upper channel layers. Six channel layers 140T are illustrated, but the number of channel layers may be varied. The channel layers 140T may further include a channel layer on the upper surface of the second active regions 105T. The channel layers 140T may be formed of a semiconductor material, and may include silicon (Si), silicon germanium (SiGe), or germanium (Ge). The channel layers 140T may include the same material, or may include different materials.

The first device DV1 may further include dummy channel layers 140E, 140B, and 140C. The first structure E may include first dummy channel layers 140E. The second structure B may include second dummy channel layers 140B. The third structure C may include third dummy channel layers 140C. The dummy channel layers 140E, 140B, and 140C may be a dummy structure not functioning as channel layers. The dummy channel layers 140E, 140B, and 140C may be a structure formed by being stacked together through a process of forming the channel layers 140T. Thus, at least a portion of the dummy channel layers 140E, 140B, and 140C may have substantially the same stack structure as that of the channel layers 140T. For example, the dummy channel layers 140E, 140B, and 140C may be stacked on the first active regions 105E, 105B, 105C and may be spaced apart from each other in the Z-direction perpendicular to the substrate 101. The first dummy channel layer 140E of the first structure E may be doped with impurities and may form a portion of the first lower impurity region 151E. At least a portion of the third dummy channel layer 140C of the third structure C may be doped with impurities and may form a portion of the third lower impurity region 151C.

The source/drain regions 150T may be on the second active regions 105T on at least one side of the channel layers 140T. The source/drain regions 150T may cover the upper surfaces of the second active regions 105T on a side surface of each of the channel layers 140T and on lower ends of the source/drain regions 150T. The source/drain regions 150T may be in contact with the channel layers 140T. The source/drain regions 150T may partially recess the upper portions of the second active regions 105T, but the presence of the recess and the depth thereof may be varied. The source/drain regions 150T may be a semiconductor layer including silicon (Si), and may include epitaxial layers.

The lower source/drain region 151T may be an epitaxial layer having the first-type conductivity on the second active regions 105T. The lower source/drain region 151T may be a single semiconductor layer. The lower source/drain region 151T may cover side surfaces of the first lower channel layers.

The upper source/drain region 152T may be an epitaxial layer having second-type conductivity, different from the first-type conductivity on the lower source/drain region 151T. The upper source/drain region 152T may be a single semiconductor layer. The upper source/drain region 152T may cover side surfaces of the first upper channel layers. The lower source/drain region 151T may have N-type conductivity. The upper source/drain region 152T may have P-type conductivity.

The inter-source/drain region insulating layer 153T may be disposed between the lower source/drain region 151T and the upper source/drain region 152T. The inter-source/drain region insulating layer 153T may be on the lower source/drain region 151T. The lower source/drain region 151T and the upper source/drain region 152T may be spaced apart from each other by the inter-source/drain region insulating layer 153T. Thus, the inter-source/drain region insulating layer 153T may electrically isolate the lower source/drain region 151T from the upper source/drain region 152T. The inter-source/drain region insulating layer 153T may include silicon nitride, silicon oxide, or silicon nitride oxide, for example.

A liner 154T may be further included on a sidewall of the inter-source/drain region insulating layer 153T. One side of the liner 154T may be in contact with the inter-source/drain region insulating layer 153T. The other side of the liner 154T may be in contact with the gate structures 160T. The liner 154T may electrically separate the upper source/drain region 152T from the lower source/drain region 151T together with the inter-source/drain region insulating layer 153T. The liner 154T may include an insulating material, e.g., silicon nitride, silicon oxide, or silicon oxynitride. The liner 154T may include a different material with the inter-source/drain region insulating layer 153T.

As integration density of the semiconductor device increases, by arranging source/drain regions of different types of conductivity vertically instead of being disposed horizontally, performance of the semiconductor device may improve. Also, reliability of the semiconductor device may improve due to disposing the insulating layer between the source/drain regions.

The gate structures 160T may intersect the second active regions 105T and the channel layers 140T on the second active regions 105T and the channel layers 140T, and may extend in one direction, e.g., the Y-direction. Channel regions of transistors may be formed in the second active regions 105T and/or the channel layers 140T intersecting the gate structures 160T.

Each of the gate structures 160T may include a gate dielectric layer 162, a gate electrode 165, a spacer structure 164, and a capping layer 166. The upper and lower surfaces of each of the gate structures 160T may be in contact with the channel layers 140T between the channel layers 140T.

The gate dielectric layer 162 may be disposed between each of the second active regions 105T and the gate electrode 165, and between the channel layers 140T and the gate electrode 165, and may cover at least a portion of the surfaces of the gate electrode 165. For example, the gate dielectric layer 162 may surround overall surfaces other than an uppermost surface of the gate electrode 165. The gate dielectric layer 162 may extend to a region between the gate electrode 165 and the spacer structure 164. The gate dielectric layer 162 may include oxide, nitride, or a high-k material. The high-k material may refer to a dielectric material having a dielectric constant higher than that of a silicon oxide film ($SiO_2$). The high-k material may refer to a dielectric material having a dielectric constant higher than that of a silicon oxide layer ($SiO_2$). The high-K material may be aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$). The gate dielectric layer 162 may be configured as multiple layers.

The gate electrode 165 may fill a region between the channel layers 140T, and may extend to a region above the channel layers 140T on the second active regions 105T. The gate electrode 165 may be spaced apart from the channel layers 140T by the gate dielectric layer 162. The gate electrode 165 may include a conductive material, e.g., a metal nitride such as titanium nitride (TiN), tantalum nitride (TaN), or tungsten nitride (WN), and/or a metal material such as aluminum (Al), tungsten (W), or molybdenum (Mo), or a semiconductor material such as doped polysilicon. The gate electrode 165 may configured as two or more multilayers. Depending on the configuration of the semiconductor device 100, the gate electrode 165 may be separated by a separator between at least a portion of transistors adjacent to each other. Also, as the stacked transistor may use upper and lower source/drain regions, separators may be disposed between a portion of the channel layers 140T such that upper and lower gate electrodes may also be distinguished from each other. The gate electrode 165 may include different materials depending on transistor regions.

The spacer structure 164 may be on both sidewalls of the gate electrode 165, and may extend in the Z-direction perpendicular to the upper surface of the substrate 101. The width of the upper portion of each of the spacer structures 164 may include a portion smaller than the width of the lower portion. The spacer structure 164 may include an upper surface curved outwardly toward the substrate 101. However, the shape of the spacer structure 164 may be varied. The spacer structure 164 may insulate the source/drain regions 150 from the gate electrode 165. The spacer structure 164 may be configured as multiple layers. The spacer structure 164 may be formed of oxide, nitride, and oxynitride.

The capping layer 166 may be on the gate electrode 165. The capping layer 166 may be configured as a structure for protecting the gate electrode 165 from etching in a subsequent process after the gate electrode 165 is formed. The capping layer 166 may include silicon nitride or a silicon nitride-based insulating material.

The semiconductor device 100 may further include internal spacer layers disposed in parallel with the gate electrode 165 between the channel layers 140T. The gate electrode 165 may be spaced apart from the source/drain regions 150 by the internal spacer layers, and may be electrically isolated from the source/drain regions 150. Side surfaces of the internal spacer layers opposing the gate electrode 165 may have an inwardly rounded shape, inwardly rounded toward the gate electrode 165. The internal spacer layers may be formed of oxide, nitride, or oxynitride, and in particular, a low-k film. The internal spacer layers may be disposed in parallel to a portion of the gate electrode 165. The internal spacer layers may be disposed in a region in contact with the source/drain region having N-type conductivity. The internal spacer layers may not be disposed in a region in contact with the source/drain region having P-type conductivity. When the lower source/drain region 151T has N-type conductivity and the upper source/drain region 152T has P-type conductivity, the internal spacer layers may be formed only in the region in contact with the lower source/drain region 151T. In another implementation, the internal spacer layers may not be provided.

The first device DV1 may further include dummy gate structures 160B and 160C. The dummy gate structures 160B and 160C may be spaced apart from the gate structures 160T, and may intersect at least a portion of the first active regions 105E, 105B, and 105C, and may have the same structure as that of the gate structures 160T. The dummy gate structures 160B and 160C may be structures formed together in the process of forming the gate structures 160T. However, the dummy gate structures 160B and 160C may not work as gate structures. The dummy gate structures 160B and 160C may respectively correspond to a first dummy gate structure 160B intersecting the base active region 105B and a second dummy gate structure 160C intersecting the collector active region 105C. Thus, the first dummy gate structure 160B may be on the second structure B, and the second dummy gate structure 160C may be on the third structure C. However, the dummy gate structure may not be on the first structure E. The first structure E may be formed by removing the dummy gate structures on the upper end to improve emitter performance. In another implementation, by allowing the dummy gate structure to remain rather than removing the dummy gate structure, the dummy gate structure may be formed on the upper end of the first structure E.

The first structure E of the first device DV1 may be on the emitter active region 105E. The first structure E may include the first lower impurity region 151E having the second-type conductivity different from the conductivity of the lower source/drain region 151T, e.g., P-type conductivity, and a first upper impurity region 152E on the first lower impurity region 151E and having the second-type conductivity. An impurity concentration of the first lower impurity region 151E may be lower than an impurity concentration of the first upper impurity region 152E. The impurity concentration of the first lower impurity region 151E may be, e.g., in the range of about $1 \times 10^{19}/cm^3$ to $5 \times 10^{19}/cm^3$. The impurity concentration of the first upper impurity region 152E may be, e.g., in the range of about $1 \times 10^{20}/cm^3$ to $5 \times 10^{20}/cm^3$. The first lower impurity region 151E may include a stack structure of first and second semiconductor layers alternately stacked. The first upper impurity region 152E may include a third semiconductor layer. The first semiconductor layers may be first material layers. The second semiconductor layers may be second material layers different from the first material layers. The third material layer may be different from at least one of the first and second material layers. A thickness of the third material layer may be greater than a thickness of each of the first and second material layers. The third semiconductor layer may be configured as a single material layer. The third semiconductor layer may include multiple layers. The first semiconductor layers may be configured as the first dummy channel layer 140E. The first semiconductor layers may include silicon (Si). The second semiconductor layers may include silicon germanium (SiGe).

The first lower impurity region 151E may be formed through an ion implantation process after the stack structure is formed. The first upper impurity region 152E may be an epitaxial layer including impurities formed through an epitaxial process.

The first lower impurity region 151E may be disposed in parallel with the lower source/drain region 151T, on substantially the same level therewith. For example, an uppermost surface of the first lower impurity region 151E may be on substantially the same level as a level of an uppermost surface of the lower source/drain region 151T.

In the first device DV1, the first upper impurity region 152E may work as the emitter. In another implementation, the first lower impurity region 151E may work as the emitter.

The second structure B of the first device DV1 may be on the base active region 105B. The second structure B may include the second lower impurity region 151B having the first-type conductivity, e.g., N-type conductivity, and the second upper impurity region 152B having the second-type conductivity, e.g., P-type conductivity. Each of the second lower impurity region 151B and the second upper impurity region 152B may be a single semiconductor layer. The second lower impurity region 151B and the second upper impurity region 152B may cover at least one side of the second dummy channel layers 140B.

The second structure B may further include the inter-impurity region insulating layer 153B on the second lower impurity region 151B. The inter-impurity region insulating layer 153B may electrically isolate the second lower impurity region 151B from the second upper impurity region 152B. The second lower impurity region 151B and the second upper impurity region 152B may be spaced apart from each other by the inter-impurity region insulating layer 153B. The inter-impurity region insulating layer 153B may include silicon nitride, silicon oxide, or silicon nitride oxide. The inter-impurity region insulating layer 153B may include the same material as that of the inter-source/drain region insulating layer 153T. The second structure B may further include a liner 154B on a sidewall of the inter-impurity region insulating layer 153B. One side of the liner 154B may be in contact with the inter-impurity region insulating layer 153B. The other side of the liner 154B may be in contact with the first dummy gate structure 160B. The liner 154B may include an insulating material, e.g., silicon nitride, silicon oxide, or silicon oxynitride, and may include the same material as that of the liner 154T of the second device DV2.

The second lower impurity region 151B may be disposed in parallel with the lower source/drain region 151T on substantially the same level therewith. For example, the uppermost surface of the second lower impurity region 151B may be on substantially the same level as a level of the uppermost surface of the lower source/drain region 151T. The second upper impurity region 152B may be disposed in parallel with the upper source/drain region 152T on substantially the same level therewith. For example, the uppermost surface of the second upper impurity region 152B may be on substantially the same level as a level of the uppermost surface of the upper source/drain region 152T.

In the first device DV1, the second lower impurity region 151B may work as the base due to having conductivity different from that of the impurity regions of the first structure E and the third structure C.

The second structure B (including the second lower impurity region 151B, the inter-impurity region insulating layer 153B, the second upper impurity region 152B, the second dummy channel layers 140B, the first dummy gate structure 160B, and the base contact plug 170B) may have a structure the same as that of the second device DV2. The PNP device may be formed using the transistor forming process, and a production yield of the semiconductor device may improve.

The third structure C of the first device DV1 may be on the collector active region 105C. The third structure C may include the third lower impurity region 151C having the second-type conductivity different from the conductivity of the lower source/drain region 151T, e.g., P-type conductivity, and the third upper impurity region 152C having the second-type conductivity. An impurity concentration of the third lower impurity region 151C may be lower than an impurity concentration of the third upper impurity region 152C. The impurity concentration of the third lower impurity region 151C may be, e.g., in the range of about $1 \times 10^{19}/cm^3$ to $5 \times 10^{19}/cm^3$. The impurity concentration of the third upper impurity region 152C may be, e.g., in the range of about $1 \times 10^{20}/cm^3$ to $5 \times 10^{20}/cm^3$. The third lower impurity region 151C may include a stack structure of first and second semiconductor layers alternately stacked. The third upper impurity region 152C may include a third semiconductor layer. The first semiconductor layers may include a first material layer. The second semiconductor layers include a second material layer different from the first material layer. The third semiconductor layer may include a third material layer different from at least one of the first and second material layers. A thickness of the third material layer may be greater than a thickness of each of the first and second material layers. The third lower impurity region 151C and the third upper impurity region 152C may cover at least one side of the third dummy channel layers 140C. The third lower impurity region 151C and the third upper impurity region 152C may be in contact with each other.

The third lower impurity region 151C may be formed through an ion implantation process after the stack structure is formed. The third upper impurity region 152C may be an epitaxial layer including impurities formed through an epitaxial process. However, the processes for forming the third lower impurity region 151C and the third upper impurity region 152C are not limited thereto, and may be varied.

The third lower impurity region 151C may be disposed in parallel with the lower source/drain region 151T on substantially the same level therewith. For example, an uppermost surface of the third lower impurity region 151C may be on substantially the same level as a level of an uppermost surface of the lower source/drain region 151T.

In the first device DV1, the third upper impurity region 152C may work as the collector. In another implementation, the third lower impurity region 151C may work as the collector.

The third structure C, the second dummy gate structure 160C, and the collector contact plug 170C may include a structure similar to that of the second device DV2. For example, the third structure C, the second dummy gate structure 160C, and the collector contact plug 170C may have the same structure as that of the second device DV2 (other than the different structures of the third upper impurity region 152C, the upper source/drain region 152T, and the inter-source/drain region insulating layer 153T).

The first contact plugs 170E, 170B, and 170C may respectively correspond to an emitter contact plug 170E, a base contact plug 170B, and a collector contact plug 170C.

Each of the first contact plugs 170E, 170B, and 170C may have a hole shape having an inclined side surface having a width decreasing in the direction toward the substrate 101, depending on an aspect ratio. Each of the first contact plugs 170E, 170B, and 170C may include a plug layer. The plug layer may include a metal nitride such as a titanium nitride film (TiN), a tantalum nitride film (TaN), or a tungsten nitride film (WN), and/or a metal material such as aluminum (Al), tungsten (W), or molybdenum (Mo).

The emitter contact plug 170E may penetrate the interlayer insulating layer 190 to be connected to the first upper impurity region 152E, and may apply an electrical signal to the first upper impurity region 152E. The emitter contact plug 170E may be recessed from the first upper impurity region 152E by a predetermined depth. The emitter contact plug 170E may be connected to the first upper impurity region 152E having an impurity concentration higher than that of the first lower impurity region 151E, such that electrical properties may improve. In another implementation, the emitter contact plug 170E may penetrate the first upper impurity region 152E, and may be connected to the first lower impurity region 151E. The emitter contact plug 170E may include the plug layer but, differently from the base contact plug 170B, the emitter contact plug 170E may not include a sidewall insulating layer.

The base contact plug 170B may penetrate the interlayer insulating layer 190 and the second upper impurity region 152B, may be connected to the second lower impurity region 151B, and may apply an electrical signal to the second lower impurity region 151B. The base contact plug 170B may be recessed from the second lower impurity region 151B by a predetermined depth. The base contact plug 170B may be connected to the second lower impurity region 151B having a type of conductivity different from that of the impurity regions connected to the emitter contact plug 170E and the collector contact plug 170C, and may apply an electrical signal to the base region. The base contact plug 170B may include a plug layer 170B-1 and a sidewall insulating layer 170B-2 covering a side surface of the plug layer 170B-1. The sidewall insulating layer 170B-2 may electrically isolate the plug layer 170B-1 from the second upper impurity region 152B. Each of the plug layer 170B-1 and the sidewall insulating layer 170B-2 of the base contact plug 170B may include a material the same as that of a plug layer 171T-1 and a sidewall insulating layer 171T-2 of the lower contact plug 171T.

The collector contact plug 170C may penetrate the interlayer insulating layer 190, may be connected to the third upper impurity region 152C, and may apply an electrical signal to the third upper impurity region 152C. The collector contact plug 170C may be recessed from the third upper impurity region 152C by a predetermined depth. The collector contact plug 170C may be connected to the third upper impurity region 152C having an impurity concentration higher than the impurity concentration of the third lower impurity region 151C, such that electrical properties may improve. In another implementation, the collector contact plug 170C may penetrate the third upper impurity region 152C, and may be connected to the third lower impurity region 151C. Differently from the base contact plug 170B, the collector contact plug 170C may not include a sidewall insulating layer.

The second contact plugs 170T may penetrate the interlayer insulating layer 190, may be connected to the source/drain regions 150T, and may apply an electrical signal to the source/drain regions 150T. The second contact plugs 170T may be on the source/drain regions 150T, as illustrated in FIG. 3A. The second contact plugs 170T may have a relatively longer length than the source/drain regions 150T in the Y-direction. The second contact plugs 170T may have an inclined side having a width decreasing in the direction toward the substrate 101 depending on an aspect ratio. The second contact plugs 170T may be recessed from the source/drain regions 150T by a predetermined depth. The second contact plugs 170T may be configured to not be recessed into the source/drain regions 150T, and to be in contact with the upper surfaces of the source/drain regions 150T along the upper surfaces. The second contact plugs 170T may include a plug layer. The plug layer may include a metal nitride such as a titanium nitride film (TiN), a tantalum nitride film (TaN), or a tungsten nitride film (WN), and/or a metal material such as aluminum (Al), tungsten (W), or molybdenum (Mo).

The second contact plugs 170T may include the lower contact plug 171T, an upper contact plug 172T, and a common contact plug 173T. The lower contact plug 171T may be connected to the lower source/drain region 151T. The upper contact plug 172T may be connected to the upper source/drain region 152T. The common contact plug 173T may be simultaneously connected to the lower source/drain region 151T and the upper source/drain region 152T. The lower contact plug 171T may penetrate the upper source/drain region 152T, and may be electrically connected to the lower source/drain region 151T. The lower contact plug 171T may include the plug layer 171T-1 and the sidewall insulating layer 171T-2 covering a sidewall of the plug layer 171T-1. The sidewall insulating layer 171T-2 may electrically isolate the plug layer 171T-1 from the upper source/drain region 152T. The common contact plug 173T may penetrate the upper source/drain region 152T, and may be connected to the lower source/drain region 151T. The common contact plug 173T may include only the plug layer without including the sidewall insulating layer. Thus, the common contact plug 173T may be electrically connected to both the upper source/drain region 152T and the lower source/drain region 151T.

The interlayer insulating layer 190 may cover the source/drain regions 150 and the gate structures 160T, and may cover the device isolation layers 107 in a region not illustrated. The interlayer insulating layer 190 may include oxide, nitride, or oxynitride, and may include a low-k material.

Figure 4:
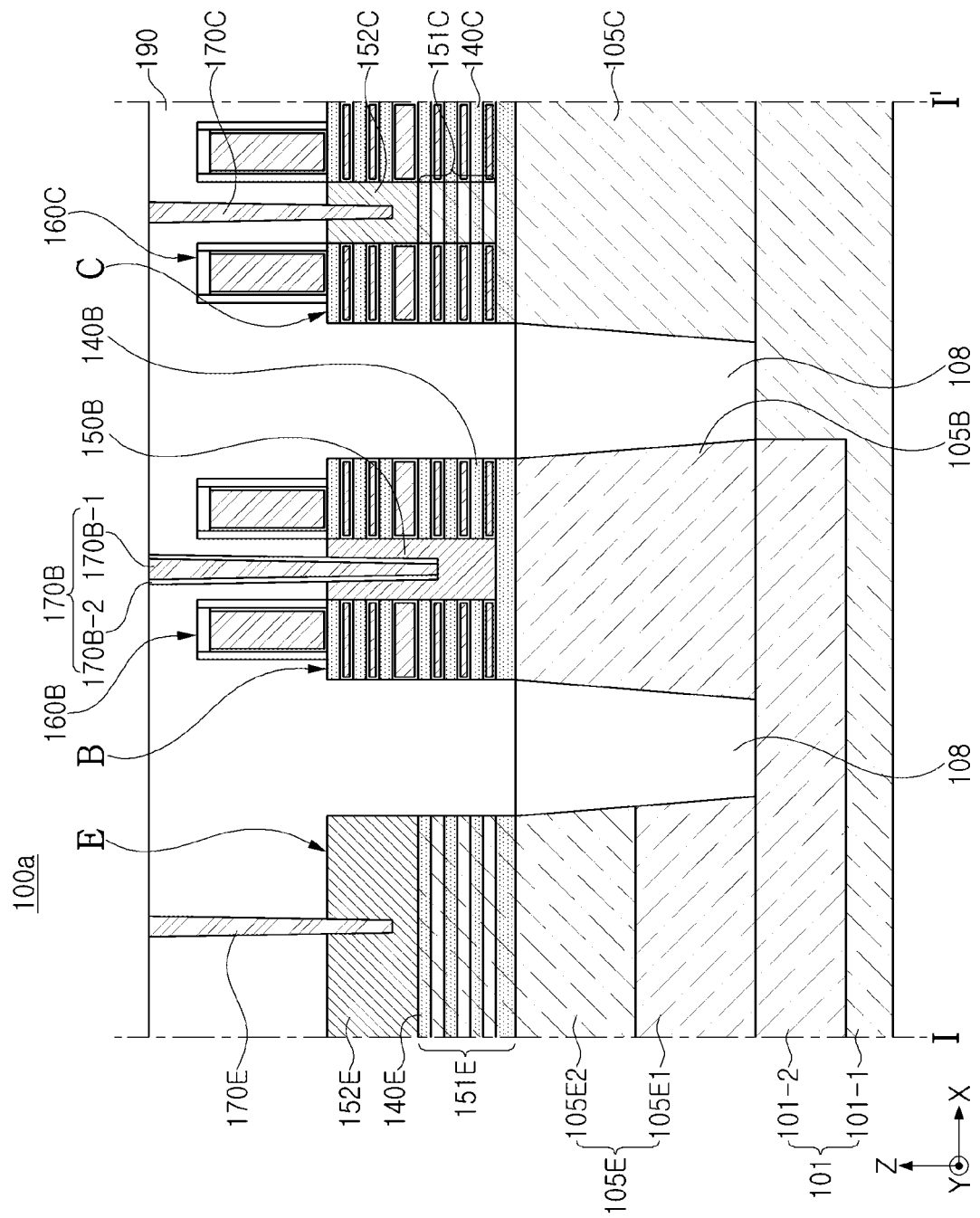
FIG. 4 is a cross-sectional diagram illustrating a semiconductor device according to an example embodiment.

FIG. 4 is a cross-sectional diagram illustrating a semiconductor device 100a according to an example embodiment, illustrating a region taken along line I-I' in FIG. 1A.

Referring to FIG. 4, the semiconductor device 100a may include the second structure B having a structure different from that of the example embodiment in FIG. 2. In detail, the second device DV2 may have the same structure as in FIGS. 3A to 3E. However, the second structure B of the first device DV1 may not include the second lower impurity region 151B (see FIG. 2) between the inter-impurity region insulating layer (see FIG. 2) and the second upper impurity region 152B (see FIG. 2).

The second structure B may include a second impurity region 150B having a single epitaxial layer. The second impurity region 150B may be a semiconductor layer having the first-type conductivity of the lower source/drain region 151T (see FIG. 3A). The second impurity region 150B may be a single layer filling the regions corresponding to the second lower impurity region 151B, the inter-impurity region insulating layer 153B, and the second upper impurity region 152B in FIG. 2. Thus, the second structure B may include the second impurity region 150B having a structure different from that of the source/drain region 150T (see FIG. 3A) of the second device DV2.

Figure 5:
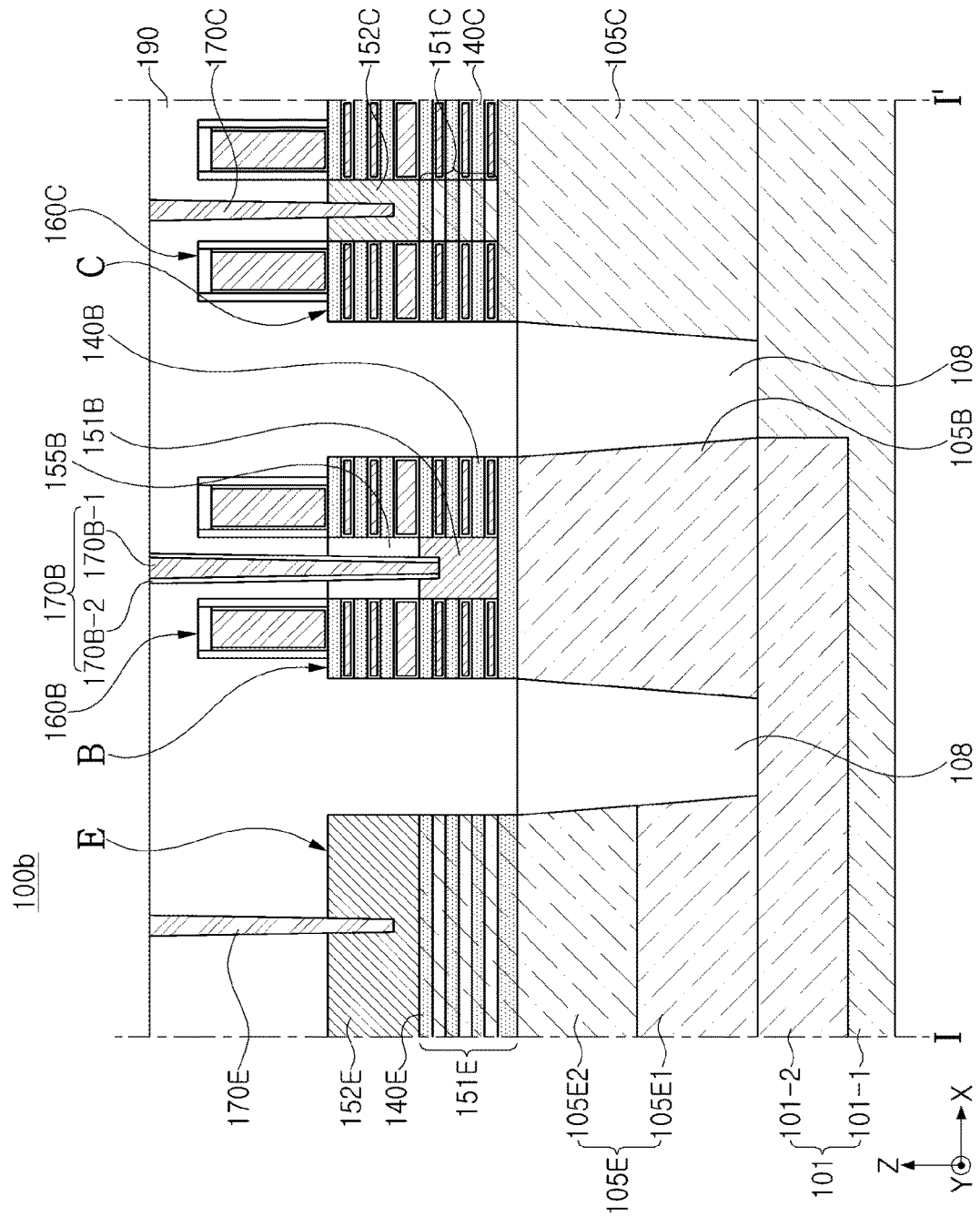
FIG. 5 is a cross-sectional diagram illustrating a semiconductor device according to an example embodiment; p

FIG. 5 is a cross-sectional diagram illustrating a semiconductor device 100b according to an example embodiment, illustrating a region taken along line I-I' in FIG. 1A.

Referring to FIG. 5, the semiconductor device 100b may include the second structure B having a structure different from that of the example embodiment in FIG. 2. In detail, the second device DV2 may have the same structure as that of the example embodiment described with reference to FIGS. 3A to 3E. However, the second structure B may not include the inter-impurity region insulating layer 153B (see FIG. 2) and the second upper impurity region 152B (see FIG. 2).

The second structure B may include the second lower impurity region 151B and a second upper insulating layer 155B on the second lower impurity region 151B. The second upper insulating layer 155B may be in contact with the second lower impurity region 151B, and may fill regions corresponding to the inter-impurity region insulating layer 153B and the second upper impurity region 152B in FIG. 2. The second upper insulating layer 155B may include an insulating material, e.g., oxide, nitride, or oxynitride. The second upper insulating layer 155B may electrically isolate the base contact plug 170B from the gate electrode 165 and the second dummy channel layers 140B. The base contact plug 170B may include a plug layer 170B-1 and a sidewall insulating layer 170B-2 as in FIG. 2. The base contact plug 170B may not include the sidewall insulating layer 170B-2. That is, differently from FIG. 2, since the second structure B may not include the second upper impurity region 152B, the sidewall insulating layer 170B-2 may be omitted.

Figure 6:
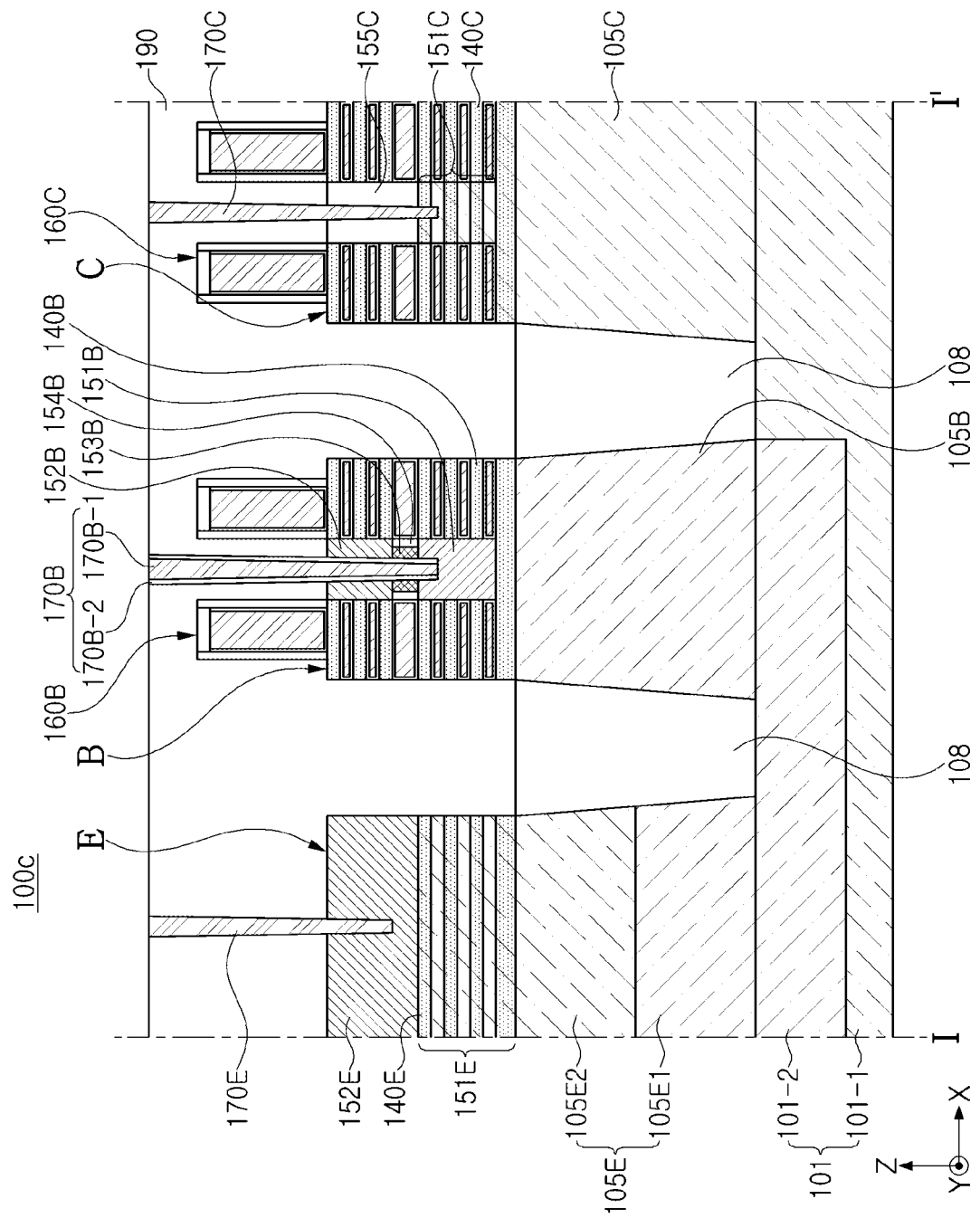
FIG. 6 is a cross-sectional diagram illustrating a semiconductor device according to an example embodiment.

FIG. 6 is a cross-sectional diagram illustrating a semiconductor device 100c according to an example embodiment, illustrating a region taken along line I-I' in FIG. 1A.

Referring to FIG. 6, the semiconductor device 100c may include the third structure C having a structure different from that of the example embodiment in FIG. 2. In detail, the second device DV2 may have the same structure as that of the example described with reference to FIGS. 3A to 3E. However, the third structure C may not include the third upper impurity region 152C (see FIG. 2).

The third structure C may include the third lower impurity region 151C and a third upper insulating layer 155C on the third lower impurity region 151C. The third upper insulating layer 155C may be in contact with the third lower impurity region 151C, and may fill a region corresponding to the third upper impurity region 152C in FIG. 2. The third upper insulating layer 155C may include an insulating material, e.g., oxide, nitride, or oxynitride. The third upper insulating layer 155C may electrically isolate the collector contact plug 170C from the gate electrode 165 and the third dummy channel layers 140C.

Figure 7:
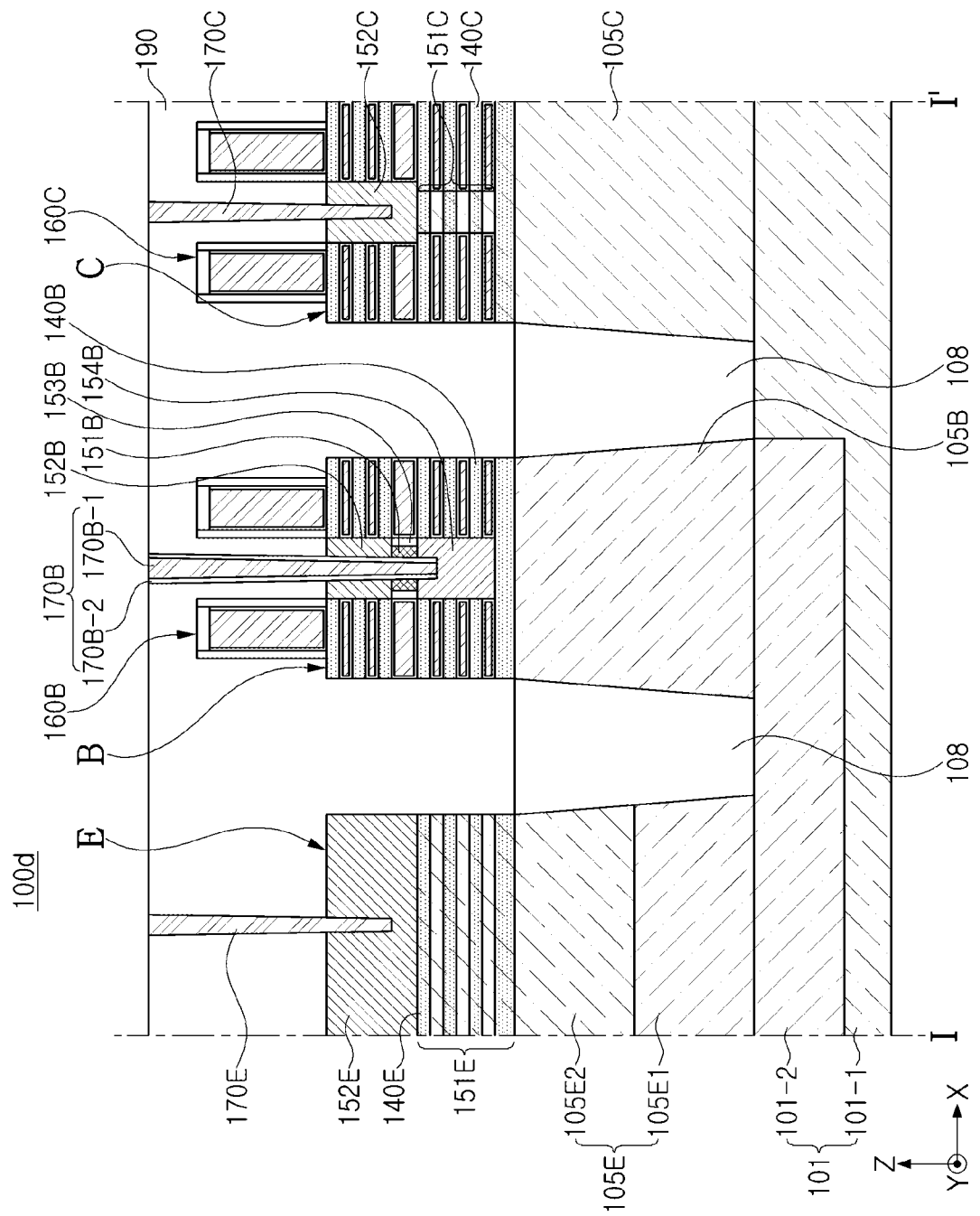
FIG. 7 is a cross-sectional diagram illustrating a semiconductor device according to an example embodiment.

FIG. 7 is a cross-sectional diagram illustrating a semiconductor device 100d according to an example embodiment, illustrating a region taken along line I-I' in FIG. 1A.

Referring to FIG. 7, the semiconductor device 100d may include the third structure C having a structure different from that of the example embodiment in FIG. 2.

The third structure C may include the third lower impurity region 151C, the third upper impurity region 152C, the second dummy gate structures 160C, and the third dummy channel layers 140C described with reference to FIG. 2, and may have a structure in which a portion of the second dummy gate structures 160C extends in the direction of the third lower impurity region 151C.

Thus, the length of the gate electrode 165 (see FIG. 3A) on the level of the third lower impurity region 151C may be greater than the length of the gate electrode 165 on the level of the third upper impurity region 152C in one direction, e.g., in the X-direction. Widths of the third lower impurity region 151C and the third upper impurity region 152C may be different. For example, the width of the third lower impurity region 151C in the X-direction may be smaller than the width of the third upper impurity region 152C in the X-direction. However, even when a portion of the second dummy gate structures 160C has the above-described structure, the gate electrode 165 (see FIG. 3A) may be electrically isolated from the third lower impurity region 151C by the gate dielectric layer 162 (see FIG. 3A).

Figure 8:
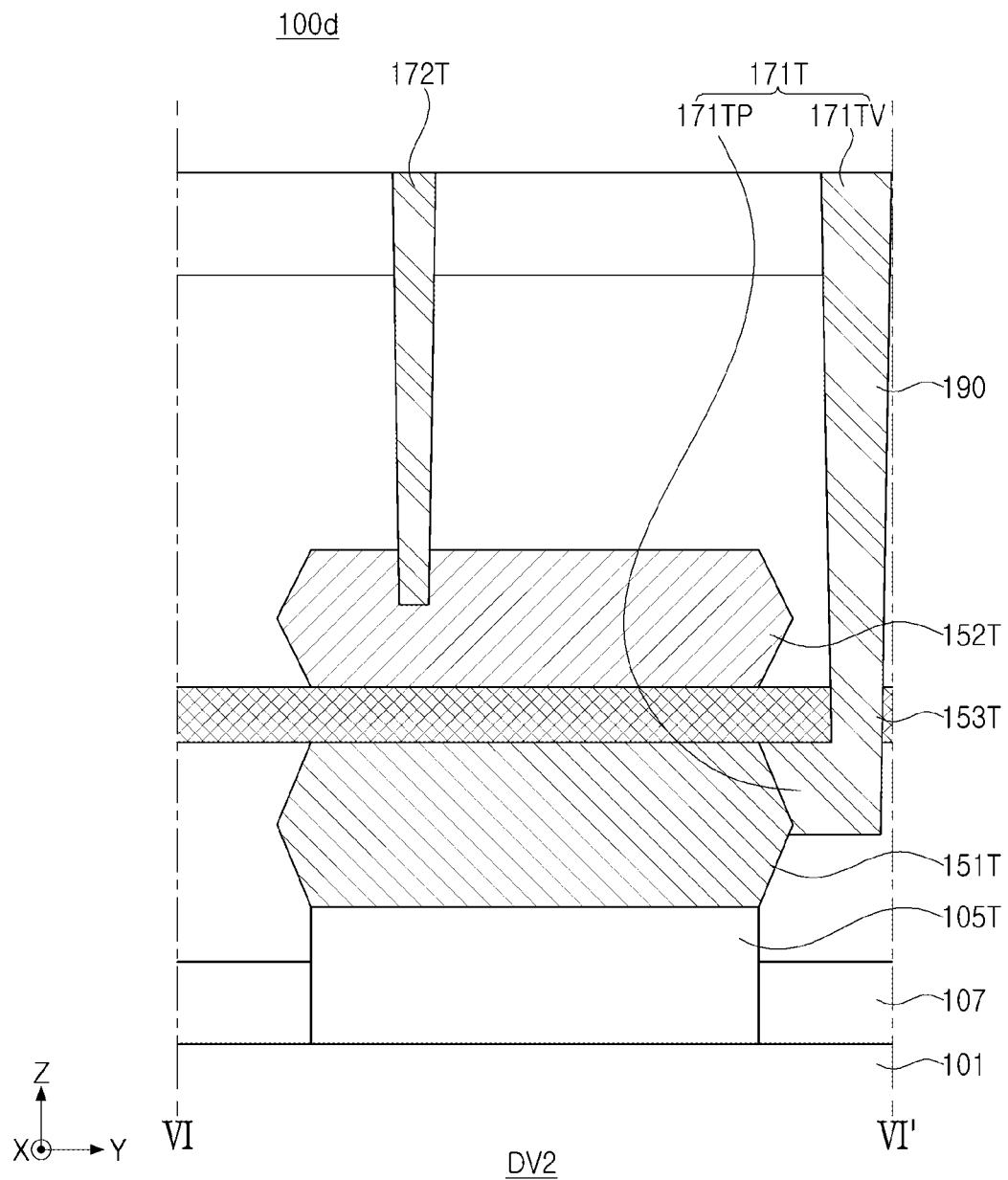
FIG. 8 is a cross-sectional diagram illustrating a semiconductor device according to an example embodiment.

FIG. 8 is a cross-sectional diagram illustrating a semiconductor device 100e according to an example embodiment, illustrating a region taken along line VI-VI' in FIG. 1B.

Referring to FIG. 8, the second contact plugs 170T and/or the base contact plug 170B of the second device DV2 may have structures different from those of the examples in FIGS. 2 and 3E.

A lower contact plug 171T of the second contact plugs 170T may include a horizontal contact plug 171TP connected to at least a portion of a side surface of the lower source/drain region 151T, and a vertical contact plug 171TV penetrating the interlayer insulating layer 190 and connected to the horizontal contact plug 171TP. The horizontal contact plug 171TP and the vertical contact plug 171TV may be integrated with each other. In an implementation, boundaries therebetween may be distinct. The horizontal contact plug 171TP and the vertical contact plug 171TV may include the same material. The vertical contact plug 171TV may penetrate the interlayer insulating layer 190 without being in contact with the upper source/drain region 152T, and may be in contact with the horizontal contact plug 171TP. The lower contact plug 171T may include a plug layer. Differently from the example embodiment in FIG. 2, the lower contact plug 171T may not include a sidewall insulating layer, e.g., the lower contact plug 171T may include the horizontal contact plug 171TP, such that the upper source/drain region 152T and the vertical contact plug 171TV may be spaced apart from each other.

The base contact plug 170B may have a structure similar to that of the lower contact plug 171T. That is, the base contact plug 170B may include a plug layer without including a sidewall insulating layer, and may include a horizontal contact plug and a vertical contact plug. The horizontal contact plug may be connected to at least a portion of the second lower impurity region 151B. The vertical contact plug may penetrate the interlayer insulating layer 190 without being in contact with the second upper impurity region 152B and may be connected to the horizontal contact plug.

In another implementation, a portion of the second contact plug 170T and the base contact plug 170B may be configured to include the vertical contact plug and the horizontal contact plug, and other portions of the second contact plug 170T may be configured to include the sidewall insulating layer.

Figure 9A:
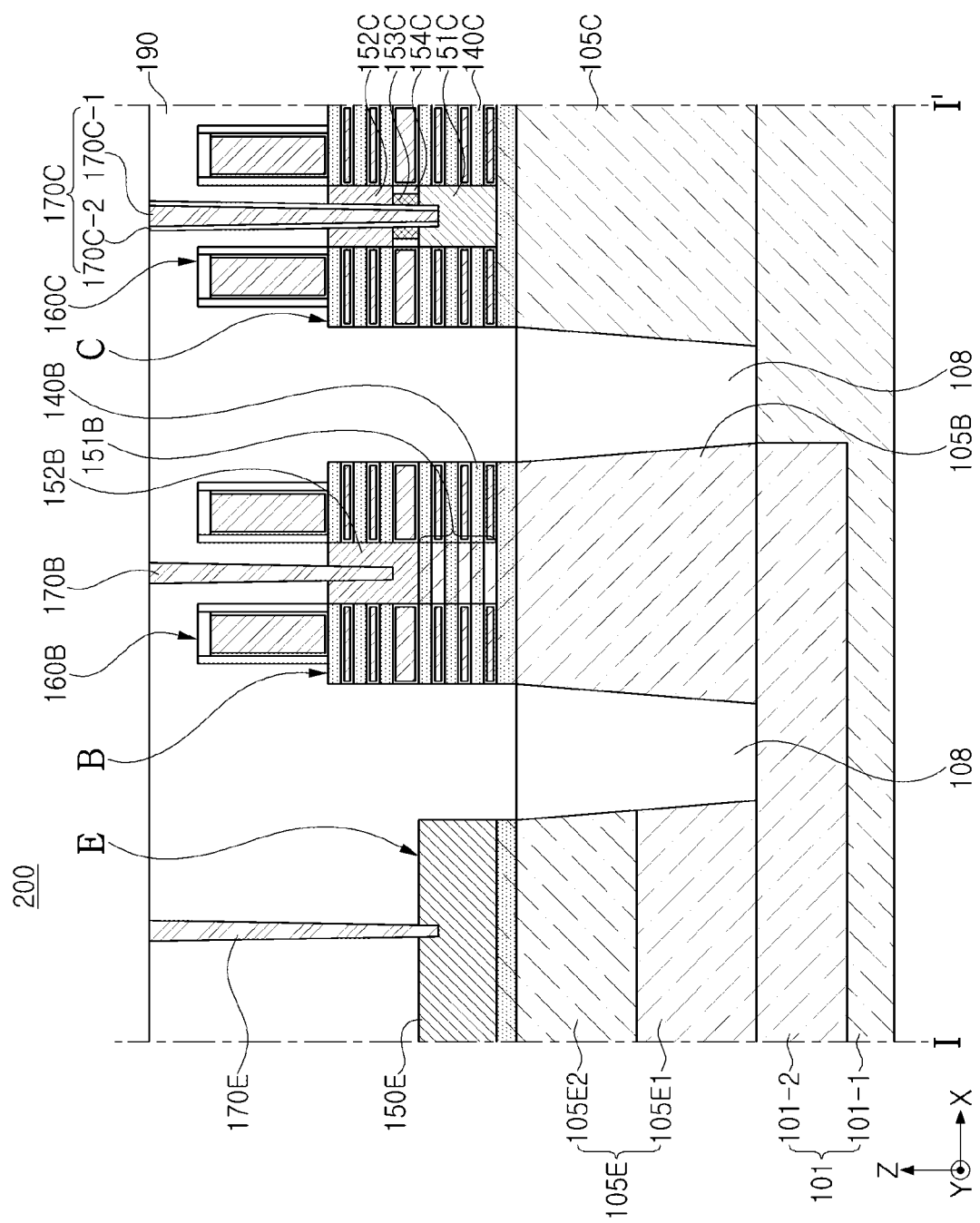
FIGS. 9A and 9B are cross-sectional diagrams illustrating a semiconductor device according to an example embodiment.
Figure 9B:
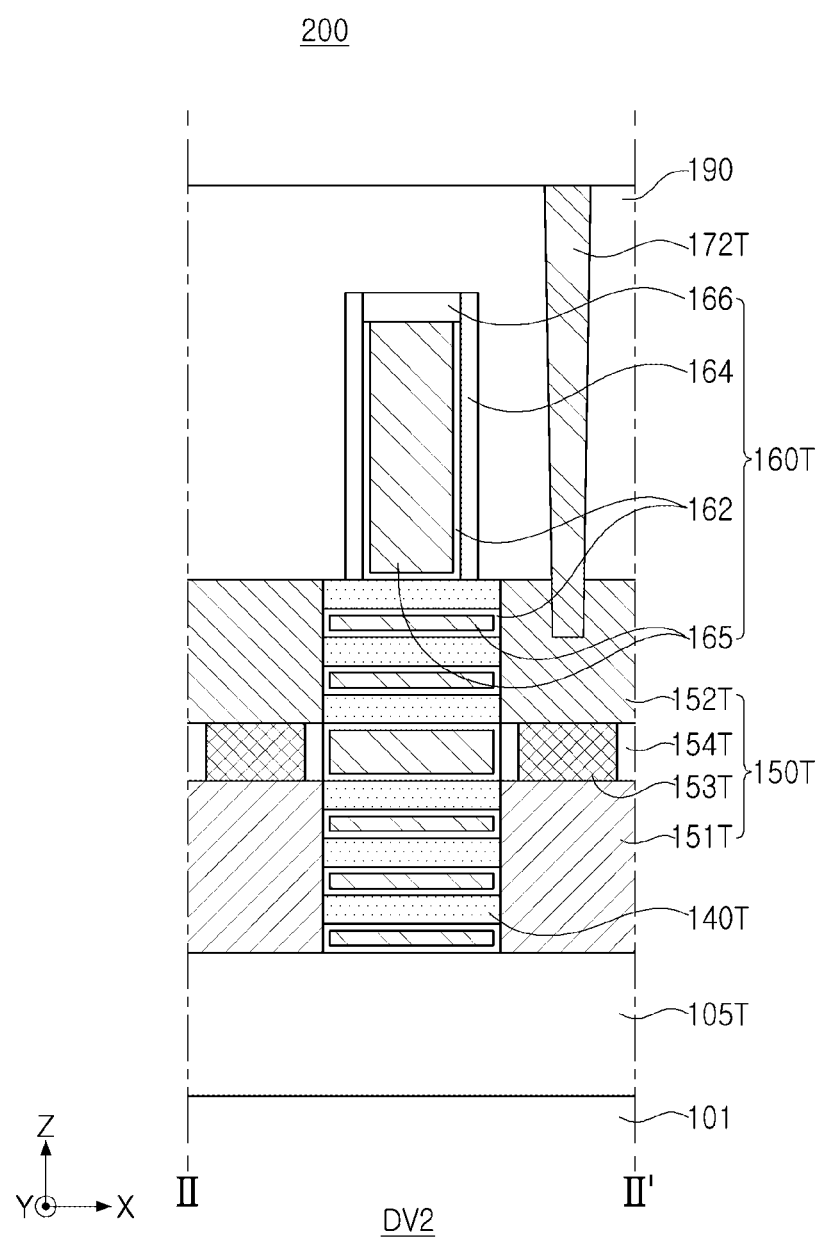

FIGS. 9A and 9B are cross-sectional diagrams illustrating a semiconductor device 200 according to an example embodiment. FIG. 9A illustrates a region taken along line I-I' in FIG. 1A. FIG. 9B illustrates a region taken along line II-II' in FIG. 1B.

Referring to FIGS. 9A and 9B, the second device DV2 and the first device DV1 may have structures different from those of the examples in FIGS. 1A to 3E.

The second device DV2 may have the same structure as that of the example embodiment in FIGS. 1B and 3A to 3E, other than the conductivity of the lower source/drain region 151T and the upper source/drain region 152T. That is, the upper source/drain region 152T may have first-type conductivity, e.g., N-type conductivity type, and the lower source/drain region 151T may have second-type conductivity different from the first-type conductivity, e.g., P-type conductivity.

The first device DV1 may include the first structure E, the second structure B, the third structure C, and the first contact plugs 170E, 170B, and 170C disposed in the first active regions 105E, 105B, and 105C.

The first active regions may include the emitter active region 105E, the base active region 105B, and the collector active region 105C spaced apart from each other. The emitter active region 105E may include the lower emitter active region 105E1 having the first-type conductivity, and the upper emitter active region 105E2 on the lower emitter active region 105E1 and having the second-type conductivity.

The first structure E may include the first impurity region 150E on the emitter active region 105E. The first impurity region 150E may have the second-type conductivity. The first impurity region 150E may be disposed in parallel with the lower source/drain region 151T on substantially the same level therewith. The first structure E may further include a semiconductor layer below the first impurity region 150E. The first impurity region 150E may be referred to as a first upper impurity region. The semiconductor layer and the upper emitter active region 105E2 of the emitter active region 105E in contact with the semiconductor layer may be referred to as the first lower impurity region. The first lower impurity region may have the second-type conductivity. An impurity concentration of the first upper impurity region may be higher than an impurity concentration of the first lower impurity region. An impurity concentration of the first lower impurity region may be, e.g., in the range of about $1 \times 10^{19}/cm^3$ to $5 \times 10^{19}/cm^3$, and an impurity concentration of the first upper impurity region may be, e.g., in the range of about $1 \times 10^{20}/cm^3$ to $5 \times 10^{20}/cm^3$. The first impurity region 150E may work as the emitter.

The second structure B may include the second lower impurity region 151B on the base active region 105B and having the first-type conductivity, and the second upper impurity region 152B on the second lower impurity region 151B and having the first-type conductivity. An impurity concentration of the second lower impurity region 151B may be lower than an impurity concentration of the second upper impurity region 152B. The impurity concentration of the second lower impurity region 151B may be, e.g., in the range of about $1 \times 10^{19}/cm^3$ to $5 \times 10^{19}/cm^3$. The impurity concentration of the second upper impurity region 152B may be, e.g., in the range of about $1 \times 10^{20}/cm^3$ to $5 \times 10^{20}/cm^3$. The second lower impurity region 151B may include a stack structure of first and second semiconductor layers alternately stacked. The second upper impurity region 152B may include a third semiconductor layer. The first semiconductor layers may be first material layers. The second semiconductor layers may be second material layers different from the first material layers. The third semiconductor layer may be a third material layer different from at least one of the first and second material layers. A thickness of the third material layer may be greater than a thickness of each of the first and second material layers. The second lower impurity region 151B and the second upper impurity region 152B may be in contact with each other, and may be in contact with at least one side of the second dummy channel layers 140B. The second lower impurity region 151B may be formed through an ion implantation process after the stack structure is formed. In the second upper impurity region 152B, an epitaxial layer including impurities may be formed through an epitaxial process. However, the processes for forming the second lower impurity regions 151B and the second upper impurity regions 152B may be varied. The second lower impurity region 151B may be disposed in parallel with the lower source/drain region 151T on substantially the same level therewith. The second upper impurity region 152B may work as the base. In another implementation, the second lower impurity region 151B may work as the base.

The third structure C may be on the collector active region 105C. The third structure C may include the third lower impurity region 151C having the second-type conductivity and the third upper impurity region 152C having the first-type conductivity. Each of the third lower impurity region 151C and the third upper impurity region 152C may be configured as a single semiconductor layer, and each of the layers may include multiple layers. The third lower impurity region 151C and the third upper impurity region 152C may cover at least one side of the third dummy channel layers 140C. The third structure C may further include an inter-impurity region insulating layer 153C on the third lower impurity region 151C. The inter-impurity region insulating layer 153C may electrically isolate the third lower impurity region 151C from the third upper impurity region 152C. The third lower impurity region 151C and the third upper impurity region 152C may be spaced apart from each other by the inter-impurity region insulating layer 153C. The inter-impurity region insulating layer 153C may include silicon nitride, silicon oxide, or silicon nitride oxide. The inter-impurity region insulating layer 153C may include the same material as that of the inter-source/drain region insulating layer 153T. The third structure C may further include a liner 154C on a sidewall of the inter-impurity region insulating layer 153C. One side of the liner 154C may be in contact with the inter-impurity region insulating layer 153C. The other side of the liner 154C may be in contact with the second dummy gate structure 160C. The liner 154C may include an insulating material, e.g., silicon nitride, silicon oxide, or silicon oxynitride, and may include the same material as that of the liner 154T of the second device DV2. The third lower impurity region 151C may be disposed in parallel with the lower source/drain region 151T on substantially the same level therewith. For example, the uppermost surface of the third lower impurity region 151C may be on substantially the same level as a level of the uppermost surface of the lower source/drain region 151T. The third upper impurity region 152C may be disposed in parallel with the upper source/drain region 152T on substantially the same level therewith. The third lower impurity region 151C may work as the collector. The third structure C (including the third lower impurity region 151C, the inter-impurity region insulating layer 153C, the third upper impurity region 152C, the third dummy channel layers 140C, the second dummy gate structure 160C, and the collector contact plug 170C) may have the same structure as that of the second device DV2. The PNP device may be formed using a transistor forming process, and a production yield of the semiconductor device may improve.

The first contact plugs 170E, 170B, and 170C may respectively correspond to the emitter contact plug 170E, the base contact plug 170B, and the collector contact plug 170C.

The emitter contact plug 170E may penetrate the interlayer insulating layer 190, may be connected to the first impurity region 150E, and may apply an electrical signal to the first impurity region 150E. The base contact plug 170B may penetrate the interlayer insulating layer 190, may be connected to the second upper impurity region 152B, and may apply an electrical signal to the second upper impurity region 152B. The base contact plug 170B may be connected to the second upper impurity region 152B having conductivity different from the conductivity of the impurity regions connected to the emitter contact plug 170E and the collector contact plug 170C, and may apply an electrical signal to the base region. The base contact plug 170B may be connected to the second upper impurity region 152B having an impurity concentration higher than that of the second lower impurity region 151B, such that electrical properties may improve. In another implementation, the base contact plug 170B may penetrate the second upper impurity region 152B, and may be connected to the second lower impurity region 151B. Differently from the lower contact plug 171T, the base contact plug 170B may not include a sidewall insulating layer. The collector contact plug 170C may penetrate the interlayer insulating layer 190 and the third upper impurity region 152C, may be connected to the third lower impurity region 151C, and may provide an electrical signal to the third lower impurity region 151C. The collector contact plug 170C may be recessed from the third lower impurity region 151C by a predetermined depth. The collector contact plug 170C may include a plug layer. The plug layer may include the same material as that of the plug layer of the second contact plugs 170T.

Figure 10:
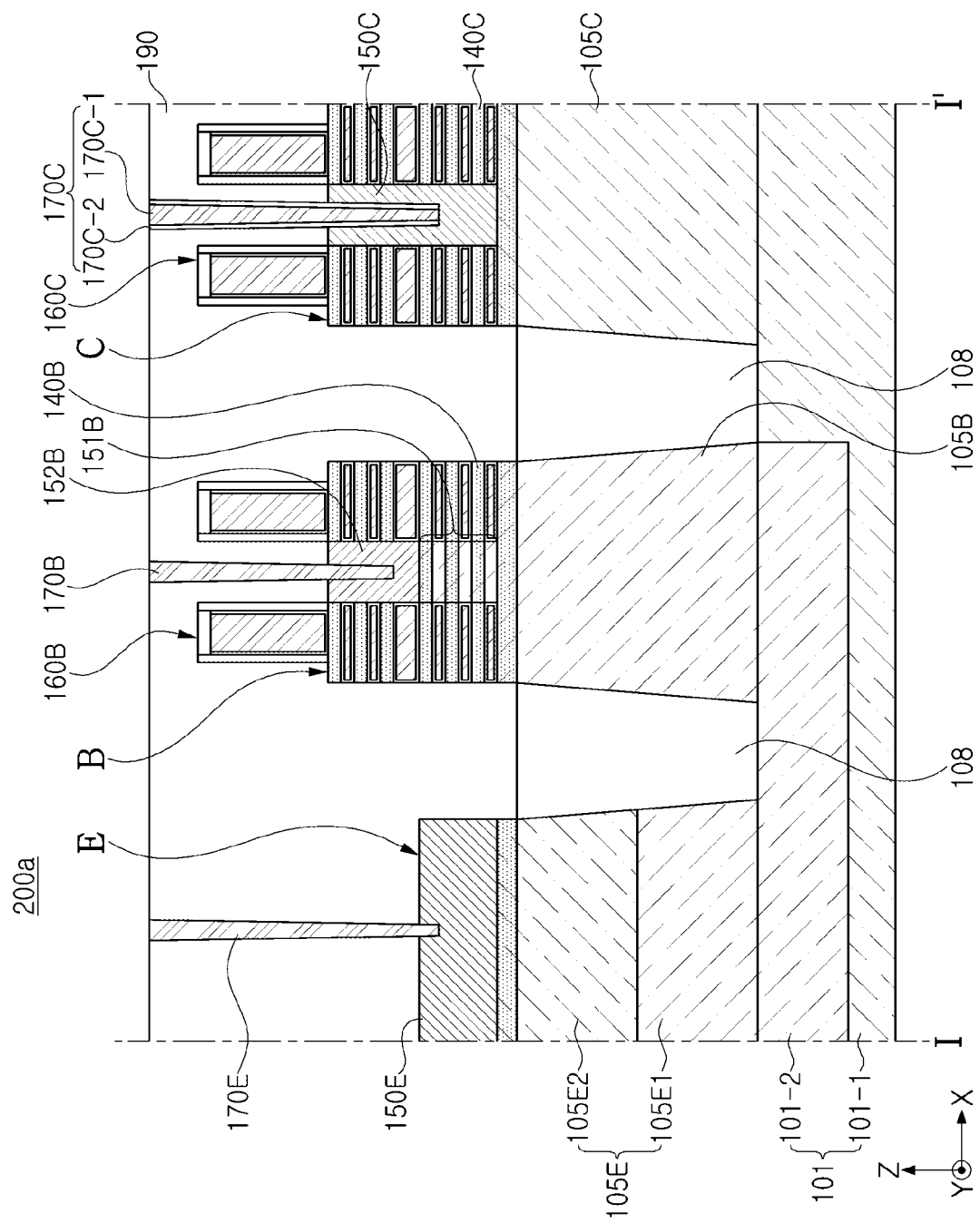
FIG. 10 is a cross-sectional diagram illustrating a semiconductor device according to an example embodiment.

FIG. 10 is a cross-sectional diagram illustrating a semiconductor device according to an example embodiment, illustrating a region taken along line I-I' in FIG. 1A.

Referring to FIG. 10, the semiconductor device 200*a* may include the third structure C different from that of the example embodiment in FIG. 9A. In detail, the second device DV2 may have the same structure as that of the example embodiment in FIG. 9B, but the third structure C may not include the third lower impurity region 151C (see FIG. 9A), the inter-impurity region insulating layer 153C (see FIG. 9A), and the third upper impurity region 152C (see FIG. 9A).

The third structure C may include a third impurity region 150C having a single epitaxial layer. The third impurity region 150C may be a semiconductor layer having the second-type conductivity of the lower source/drain region 151T (see FIG. 9B). The third impurity region 150C may be a single layer filling a region corresponding to the third lower impurity region 151C, the inter-impurity region insulating layer 153C, and the third upper impurity region 152C in FIG. 9A. Thus, the third structure C may include the third impurity region 150C having a structure different from that of the source/drain regions 150T (see FIG. 9B) of the second device DV2.

Figure 11A:
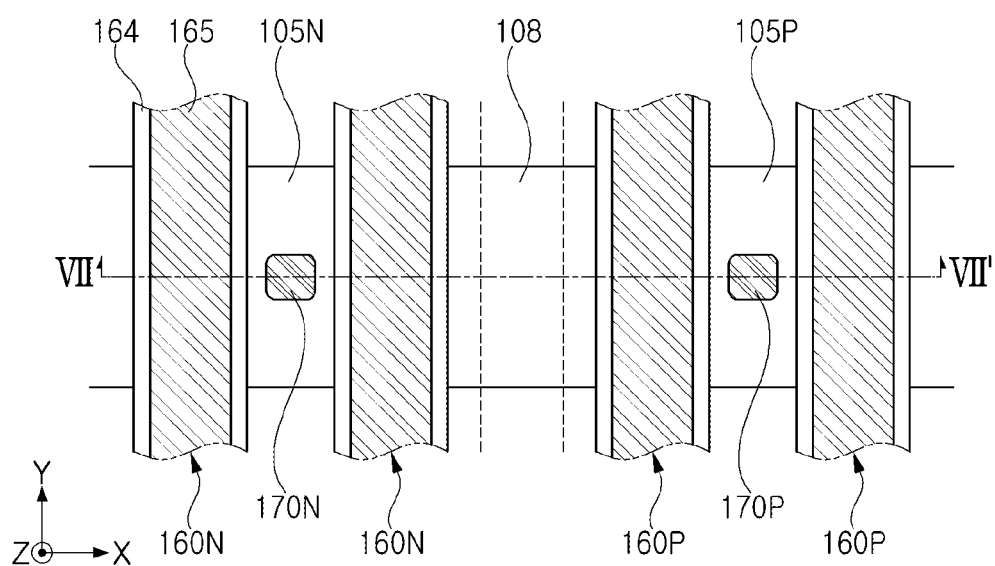
FIGS. 11A and 11B are cross-sectional diagrams illustrating a semiconductor device according to an example embodiment.
Figure 11B:
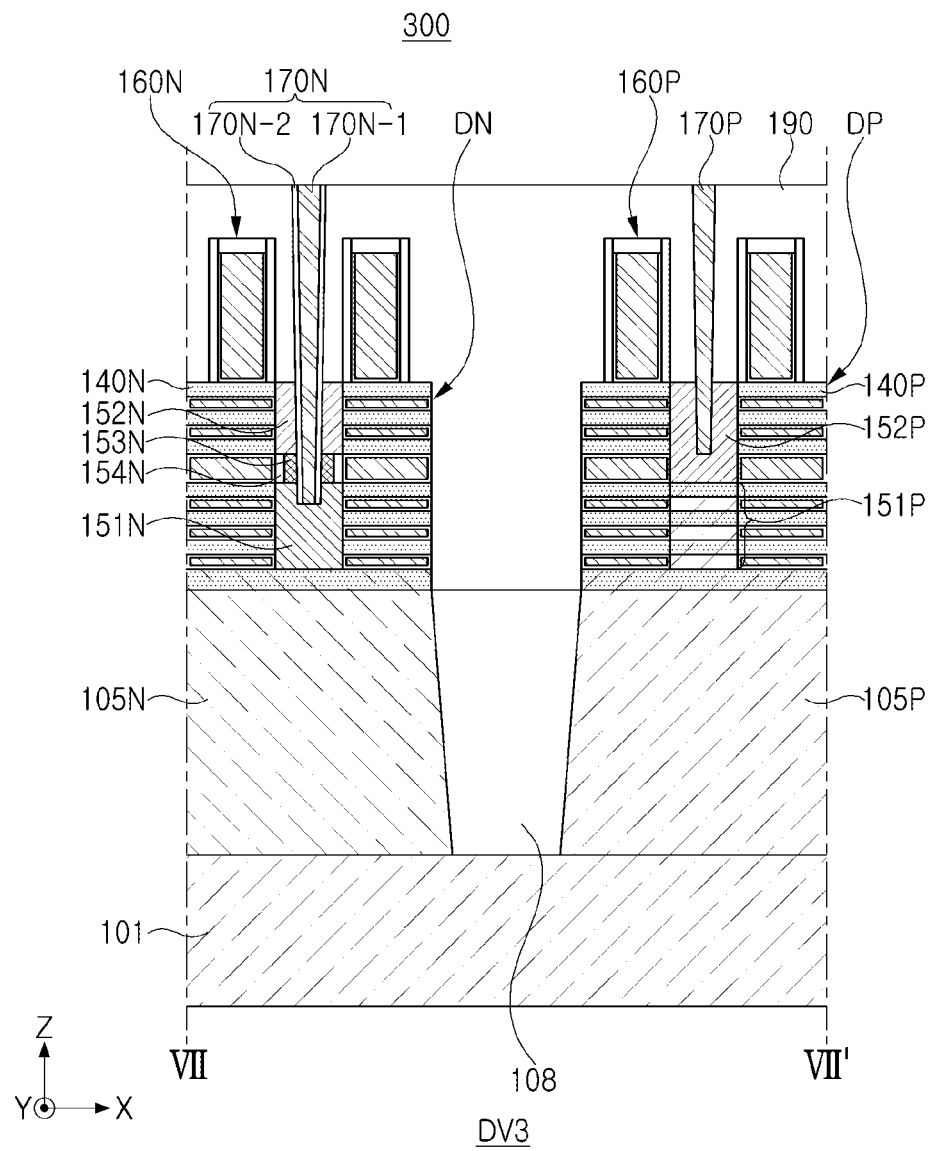

FIG. 11A is a plan diagram illustrating a semiconductor device 300 according to an example embodiment. FIG. 11B is a cross-sectional diagram illustrating a semiconductor device 300 according to an example embodiments. FIG. 11B is a cross-sectional diagram illustrating the semiconductor device 300 in FIG. 11A taken along line VII-VII'.

Referring to FIGS. 11A and 11B, the semiconductor device 300 may include a third device DV3, the second device DV2, the substrate 101, third active regions 105N and 105P spaced apart from each other on the substrate 101, the isolation insulating layers 108, a first diode structure DN, a second diode structure DP, and third contact plugs 170N and 170P. The first diode structure DN may have a structure the same as or similar to the second structure B in FIG. 2. The second diode structure DP may have a structure the same as or similar to the third structure C in FIG. 2. The third contact plugs 170N and 170P may respectively correspond to a first diode contact plug 170N and a second diode contact plug 170P. The first diode contact plug 170N may have a structure the same as or similar to the base contact plug 170B in FIG. 2. The second diode contact plug 170P may have a structure the same as or similar to that of the collector contact plug 170C in FIG. 2.

The lower impurity region 151N of the first diode structure DN may have first-type conductivity. The upper impurity region 152N of the first diode structure DN may have second-type conductivity different from the first-type conductivity. The first diode contact plug 170N may penetrate the interlayer insulating layer 190, and may be connected to the lower impurity region 151N of the first diode structure DN. The second diode contact plug 170P may penetrate the interlayer insulating layer 190, and may be connected to the upper impurity region 152P of the second diode DP. The first diode structure DN and the second diode structure DP may be electrically connected to each other by the first active regions 105N and 105P. Thus, a diode device may be provided in the stacked transistor.

The semiconductor device 300 may also provide a diode device by applying the example embodiments in FIGS. 1A to 10.

The semiconductor device 300 may further include the first device DV1 described in the example embodiment with reference to FIGS. 1A to 10 together with the second device DV2 and the third device DV3.

Figure 12A:
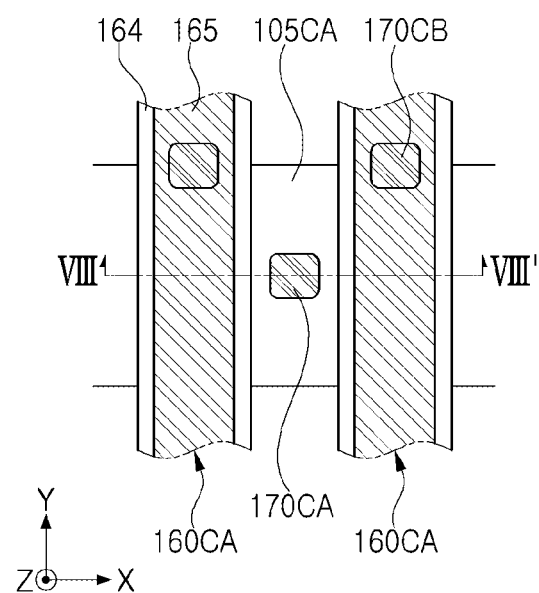
FIGS. 12A and 12B are cross-sectional diagrams illustrating a semiconductor device according to an example embodiment.
Figure 12B:
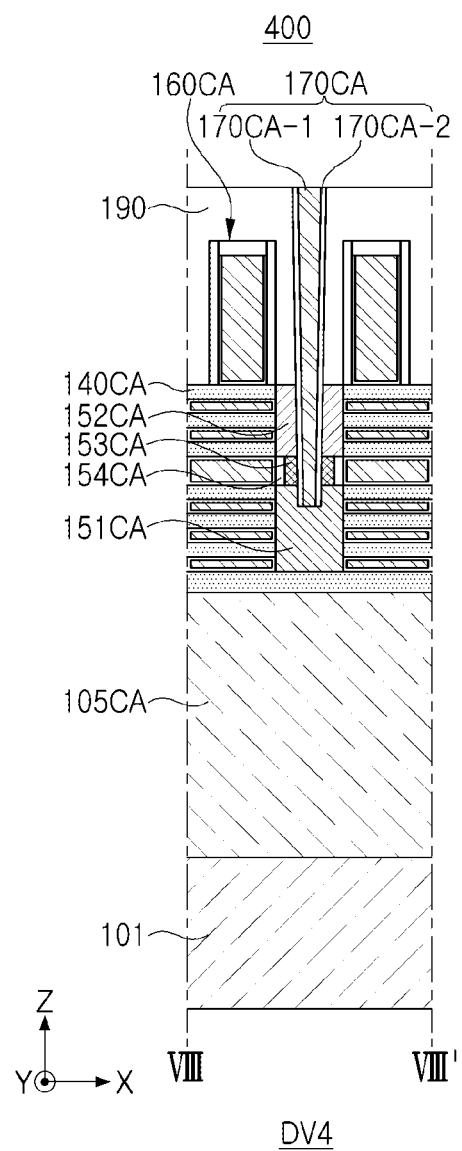

FIG. 12A is a plan diagram illustrating a semiconductor device 400 according to an example embodiment. FIG. 12B is a cross-sectional diagram illustrating a semiconductor device 400 according to an example embodiment. FIG. 12B is a cross-sectional diagram illustrating the semiconductor device 400 in FIG. 12A taken along line VIII-VIII'.

Referring to FIGS. 12A and 12B, the semiconductor device 400 may include a fourth device DV4, the second device DV2, the substrate 101, fourth active regions 105CA spaced apart from each other on the substrate, a capacitor structure CA, and a fourth contact plug 170CA. The capacitor structure CA may have a structure the same as or similar to the second structure B in FIG. 2. The fourth contact plug 170CA may have a structure the same as or similar to that of the base contact plug 170B in FIG. 2. The fourth device DV4 may further include a gate contact plug 170CB. The fourth contact plug 170CA and the capacitor lower impurity region 151CA may work as a first capacitor electrode. The gate contact plug 170CB and lower ones of the gate electrodes 165 (see FIG. 3A) may work as a second capacitor electrode. The gate dielectric layer 162 (see FIG. 3A) may work as a dielectric. Thus, the fourth device DV4 may function as a capacitor. However, the fourth device DV4 may vary from the capacitor function according to the above structure, and may perform the function of the capacitor by various combinations thereof.

The semiconductor device 400 may provide a capacitor device by applying the example embodiments in FIGS. 1A to 10.

The semiconductor device 400 may further include the first device DV1 described in the example embodiment with reference to FIGS. 1A to 10 together with the second device DV2 and the fourth device.

FIGS. 13A to 13J are diagrams illustrating stages in a method of manufacturing a semiconductor device according to an example embodiment. FIGS. 13A to 13J are enlarged cross-sectional diagrams illustrating the first structure E, the second structure B, and the third structure C in FIG. 2 to describe a method of manufacturing the first device DV1 in FIG. 1A. Since the second device DV2 in FIG. 1B may be formed by a method similar to the method of manufacturing the second structure B, the second device DV2 will be described together with the second structure B.

Figure 13A:
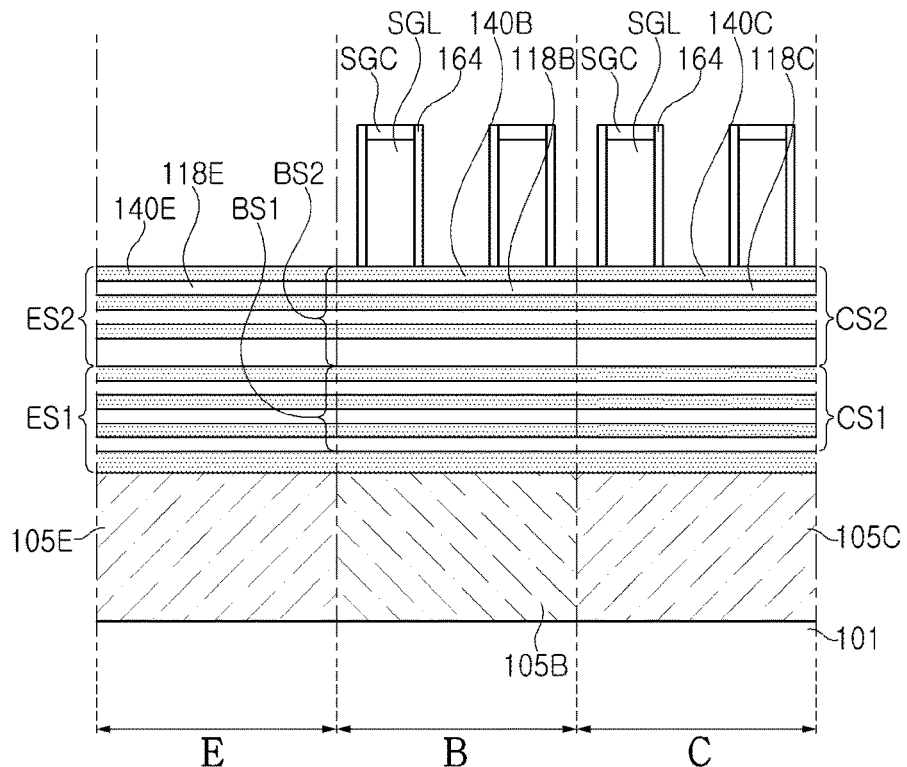
FIGS. 13A to 13J are diagrams illustrating processes of a method of manufacturing a semiconductor device in order according to an example embodiment.

Referring to FIG. 13A, first active regions 105E, 105B, and 105C may be formed on a substrate 101, sacrificial gate structures SGC and SGL intersecting the first active regions 105E, 105B, and 105C may be formed, and spacer structures 164 may be formed on both sidewalls of the sacrificial gate structures SGC and SGL.

First semiconductor layers 140E, 140B, and 140C and second semiconductor layers 118E, 118B, and 118C alternately stacked on a substrate 101 may be formed. A trench defining the first active regions 105E, 105B, and 105C may be formed by partially etching the first semiconductor layers 140E, 140B, and 140C, the second semiconductor layers 118E, 118B, and 118C, and the substrate 101. The first semiconductor layers 140E, 140B, and 140C and the second semiconductor layers 118E, 118B, and 118C may be formed by an epitaxial growth process. The second semiconductor layers 118E, 118B, and 118C may be replaced with the gate dielectric layer 162 and the gate electrode 165, as illustrated in FIGS. 2 and 3A, through a subsequent process. The second semiconductor layers 118E, 118B, and 118C may be formed of a material having etch selectivity with respect to the first semiconductor layers 140E, 140B, and 140C. The first semiconductor layers 140E, 140B, and 140C and the second semiconductor layers 118E, 118B, and 118C may be formed of, e.g., silicon (Si), silicon germanium (SiGe), or germanium (Ge), and may include different materials. The second semiconductor layers 118E, 118B, and 118C may include silicon germanium (SiGe). The first semiconductor layers 140E, 140B, and 140C may include silicon (Si). In an example embodiment, six layers of the second semiconductor layers 118E, 118B, and 118C may be stacked, although the number of the channel layers and the thickness thereof may be varied.

The first active regions 105E, 105B, and 105C may be defined by the trench. The first active regions 105E, 105B, and 105C may be formed to protrude toward the upper surface of the substrate 101 by removing a portion of the substrate 101. The first active regions 105E, 105B, and 105C may have a shape protruding from the substrate 101 in a direction perpendicular to the Z-direction, and may be formed of the same material as that of the substrate 101. The first active regions 105E, 105B, and 105C may be spaced apart from each other. Referring to FIG. 1A, the first active regions 105E, 105B, and 105C may include an emitter active region 105E, the base active region 105B surrounding the emitter active region 105E, and the collector active region 105C surrounding the base active region 105B. The base active region 105B may have first-type conductivity, e.g., N-type conductivity. The collector active region 105C may have second-type conductivity different from the first-type conductivity, such as P-type conductivity. The emitter active region 105E may have the first-type conductivity along with the base active region 105B by an impurity implantation process, but may be changed to have the second-type conductivity through a subsequent process.

The first semiconductor layers 140E and the second semiconductor layers 118E alternately stacked on the emitter active region 105E may form preliminary emitter structures ES1 and ES2. The preliminary emitter structures ES1 and ES2 may include a lower preliminary emitter structure ES1 and an upper preliminary emitter structure ES2 on the lower preliminary emitter structure ES1.

The first semiconductor layers 140B and the second semiconductor layers 118B alternately stacked on the base active region 105B may form preliminary base structures BS1 and BS2. The preliminary base structures BS1 and BS2 may include a lower preliminary base structure BS1 and an upper preliminary base structure BS2 on the lower preliminary base structure BS1.

The first semiconductor layers 140C and the second semiconductor layers 118C alternately stacked on the collector active region 105C may form preliminary collector structures CS1 and CS2. The preliminary collector structures CS1 and CS2 may include a lower preliminary collector structure CS1 and an upper preliminary collector structure CS2 on the lower preliminary collector structure CS1.

In this process, the second active regions 105T (see FIGS. 1B and 3A) may be formed by forming a trench to be spaced apart from the first active regions 105E, 105B, and 105C. The second active regions 105T may be spaced apart from each other in a linear shape, and may extend in parallel to each other. The first semiconductor layers 140T (see FIG. 3A) and the second semiconductor layers alternately stacked on the second active regions 105T may form a stack structure. The stack structure may include a lower stack structure and an upper stack structure.

The first semiconductor layers 140T on the second active regions 105T may be channel layers. The first semiconductor layers 140E, 140B, and 140C on the first active regions 105E, 105B, and 105C may be dummy channel layers.

Thereafter, isolation insulating layers 108 may be formed by filling an insulating material in the trench, which may be a region from which a portion of the substrate 101 is removed, between the first active regions 105E, 105B, and 105C, and performing a planarization process. In this process, the device isolation layers 107 may be formed by filling an insulating material in a region between the second active regions 105T and removing a portion of the insulating material to protrude the second active regions 105T. The device isolation layers 107 may be formed to cover a portion of side surfaces of the second active regions 105T. The isolation insulating layers 108 and the device isolation layers 107 may include the same material, e.g., silicon oxide.

Thereafter, the sacrificial gate structures SGC and SGL crossing the second active regions 105T and the first active regions 105E, 105B, and 105C and parallel to each other may be formed. Each of the sacrificial gate structures SGC and SGL may have a linear shape extending in one direction, e.g., the Y-direction. The sacrificial gate structures SGC and SGL may be a sacrificial structure formed in a region in which the gate dielectric layer 162 and the gate electrode 165 are above the channel layers 140T and the dummy channel layers 140B and 140C, as illustrated in FIGS. 2 and 3A, through a subsequent process. The sacrificial gate structures SGC and SGL may include a sacrificial gate layer SGL and a sacrificial gate capping layer SGC. The sacrificial gate layer SGL may be formed of, e.g., polysilicon. The sacrificial gate capping layer SGC may be formed of a silicon nitride layer.

Thereafter, spacer structures 164 may be formed on both sidewalls of the sacrificial gate structures SGC and SGL. The spacer structure 164 may be in contact with a side surface of the sacrificial gate insulating layer SGI. The spacer structure 164 may be formed by forming a film having a uniform thickness along the upper and side surfaces of the sacrificial gate structures SGC and SGL and performing anisotropic etching. The spacer structure 164 may include an insulating material, e.g., SiO, SiN, SiCN, SiOC, SiON, or SiOCN.

The sacrificial gate structures SGC, SGL and the spacer structure 164 may be formed on the base active region 105B and the collector active region 105C, which may be a portion of the first active regions 105E, 105B, and 105C, and may not be formed on the emitter active region 105E. The sacrificial gate structures SGC and SGL may not be initially formed on the emitter active region 105E but, after the sacrificial gate structures SGC and SGL are formed, a subsequent process of removing the structure on the emitter active region 105E may be performed.

In this process, the sacrificial gate structures SGC and SGL and the spacer structure 164 intersecting the second active regions 105T and parallel to each other may be formed together.

Figure 13B:
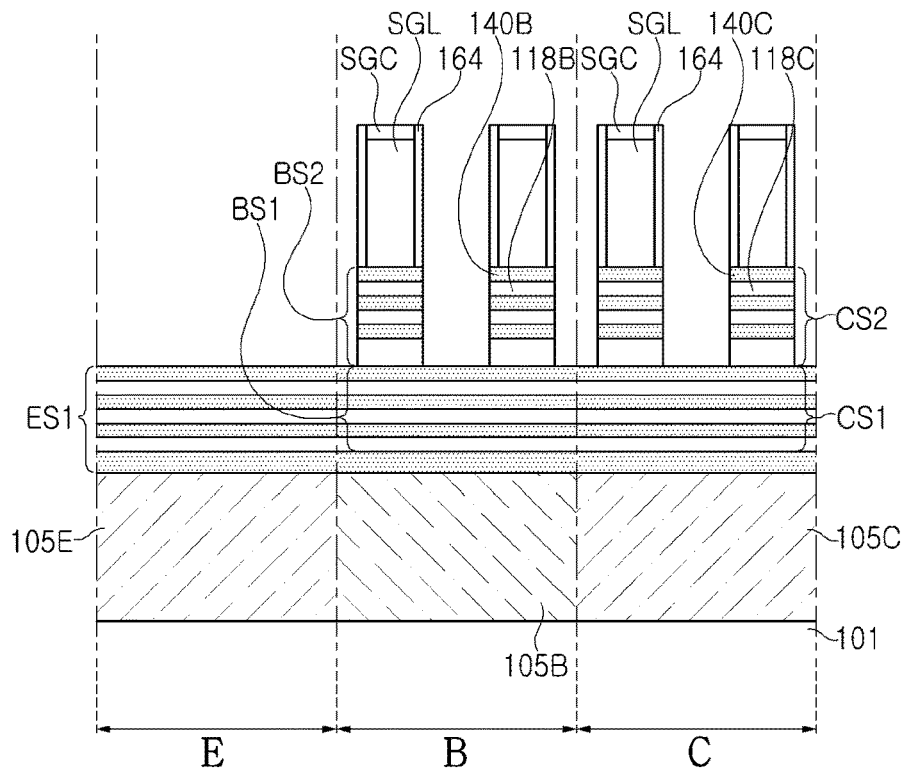

Referring to FIG. 13B, the upper preliminary emitter structure ES2, a portion of the upper preliminary base structure BS2, and a portion of the upper preliminary collector structure CS2 may be removed.

An etching process may be performed using the sacrificial gate structures SGC and SGL and the spacer structure 164 as etch masks. Thus, the upper preliminary emitter structure ES2 (in which the sacrificial gate structures SGC and SGL are not formed) may be entirely removed such that the lower preliminary emitter structure ES1 may be exposed. The area of the upper preliminary base structure BS2 and the area of the upper preliminary collector structure CS2 in which the sacrificial gate structures SGC and SGL are disposed may remain. The exposed portions of the lower preliminary emitter structure ES1, the lower preliminary base structure BS1, and the lower preliminary collector structure CS1 may be the first semiconductor layers 140E, 140B, and 140C, and the second semiconductor layers 118E, 118B, and 118C may be exposed.

In this process, a portion of the upper stack structure may also be removed using the sacrificial gate structures SGC and SGL and the spacer structure 164 as etch masks on the second active regions 105T (see FIG. 3A).

Figure 13C:
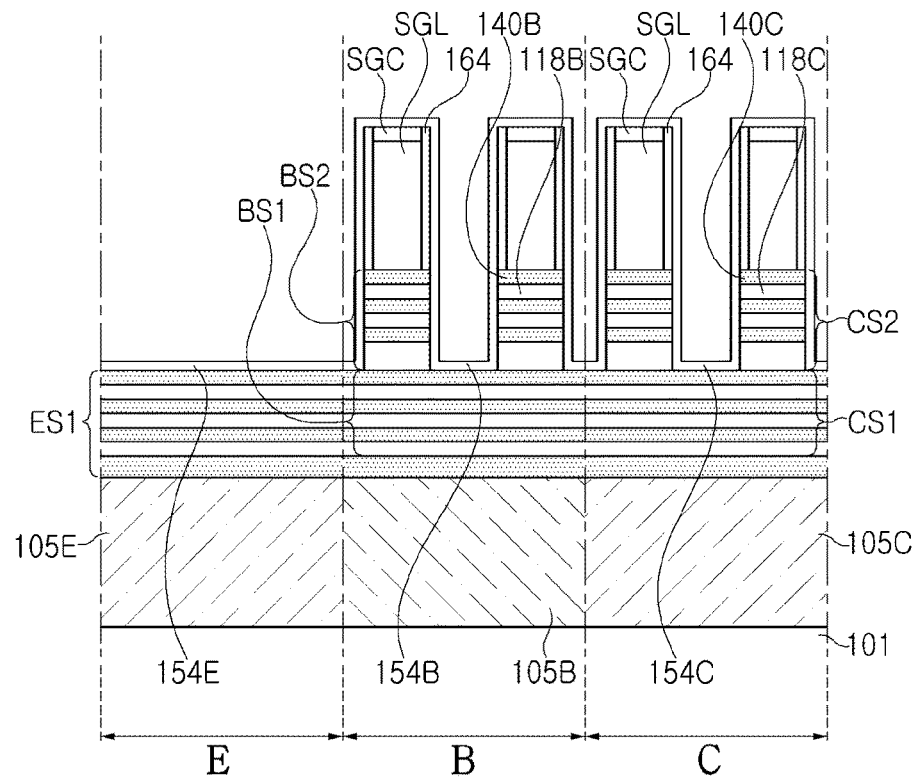

Referring to FIG. 13C, liners 154E, 154B, and 154C may be formed to conformally cover the sacrificial gate structures SGC and SGL, the spacer structure 164, the lower preliminary emitter structure ES1, the lower preliminary base structure BS1, and the lower preliminary collector structure CS1 on the first active regions 105E, 105B, and 105C. The liners 154E, 154B, and 154C may cover the upper and side surfaces of the exposed regions with a constant thickness. Thus, a portion (e.g., liner 154B) of the liners 154E, 154B, and 154C may cover the exposed side surface of the upper preliminary base structure BS2, which may prevent epitaxial growth of the semiconductor layer through the side surface of the upper preliminary base structure BS2 in a subsequent process. The liners 154E, 154B, and 154C may include an insulating material, e.g., silicon oxide, silicon nitride, or silicon oxynitride.

In this process, a liner 154T (see FIG. 3A) covering a sacrificial gate structure on the second active regions 105T and the lower stack structure may be formed together.

Figure 13D:
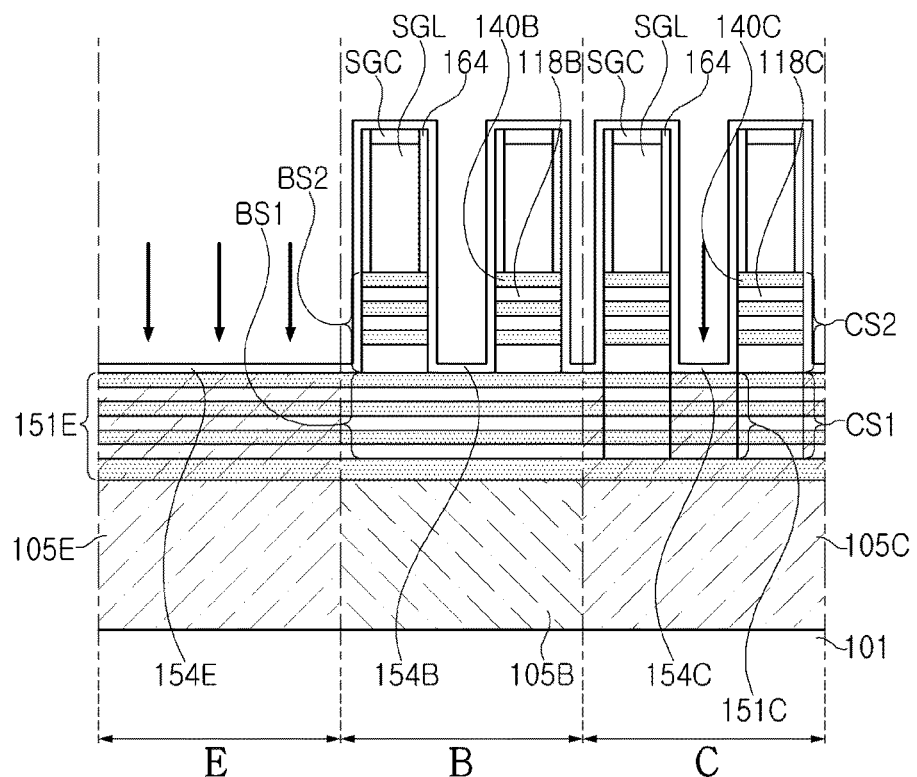

Referring to FIG. 13D, a first lower impurity region 151E and a third lower impurity region 151C may be formed.

The first lower impurity region 151E and the third lower impurity region 151C may be formed by selectively doping impurities into the lower preliminary emitter structure ES1 and the lower preliminary collector structure CS1 through an ion implantation process. Since the sacrificial gate structures are not on the lower preliminary emitter structure ES1, the entire lower preliminary emitter structure ES1 may be doped such that the first lower impurity region 151E may be formed. As the sacrificial gate structures SGC and SGL are on the lower preliminary collector structure CS1, only regions in which the sacrificial gate structures SGC and SGL are not disposed may be doped with impurities such that the third lower impurity region 151C may be formed. Impurity concentrations of the first lower impurity region 151E and the third lower impurity region 151C may be, e.g., in the range of about $1 \times 10^{19}$ to $5 \times 10^{19}/cm^3$. The conductivity of the impurity may be the second-type conductivity. Through the ion implantation process, the upper region of the emitter active region 105E (see FIG. 2) may have the second-type conductivity.

Figure 13E:
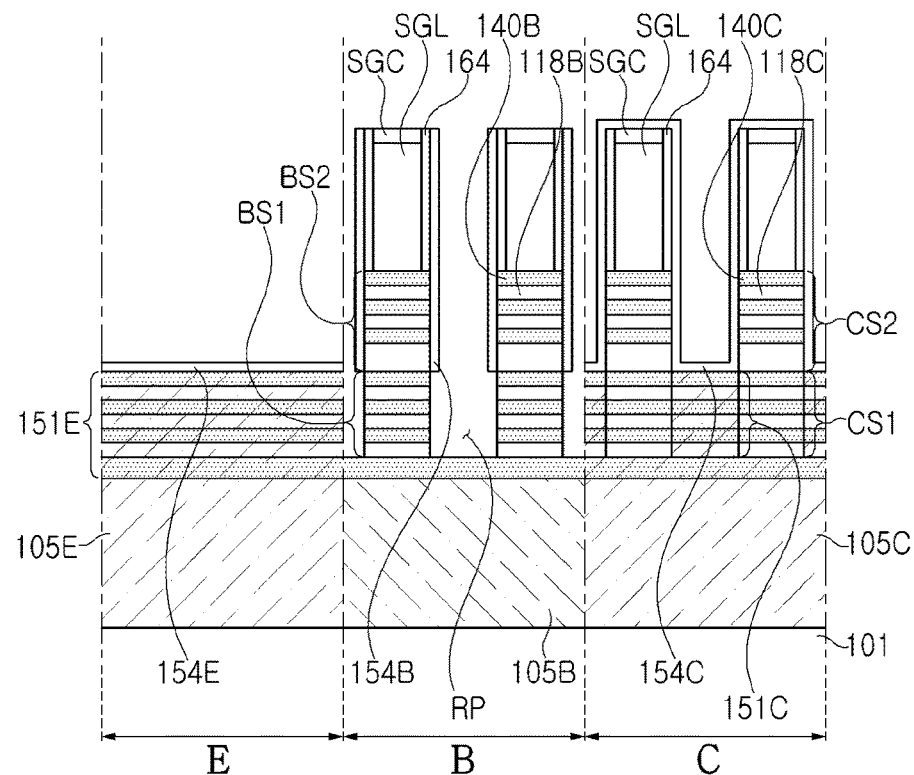

Referring to FIG. 13E, recess portion RP may be formed by removing at least a portion of the lower preliminary base structure BS1.

In the lower preliminary base structure BS1, a region of the upper surface in which the sacrificial gate structures SGC and SGL and the spacer structure 164 are not disposed may be removed through an etching process. During the etching process, the sacrificial gate structures SGC and SGL and the upper preliminary base structure BS2 may be protected from the etching by the liner 154B. Thereafter, the lower preliminary base structure BS1 below the liner 154B may be additionally etched, thereby forming the recess portion RP. Thus, the remaining lower preliminary base structures BS1 and the remaining upper preliminary base structures BS2 may have substantially the same width in one direction, e.g., the X-direction. In another implementation, the additional etching process may not be performed.

In this process, at least a portion of the lower stack structure on the second active regions 105T may be removed together.

Figure 13F:
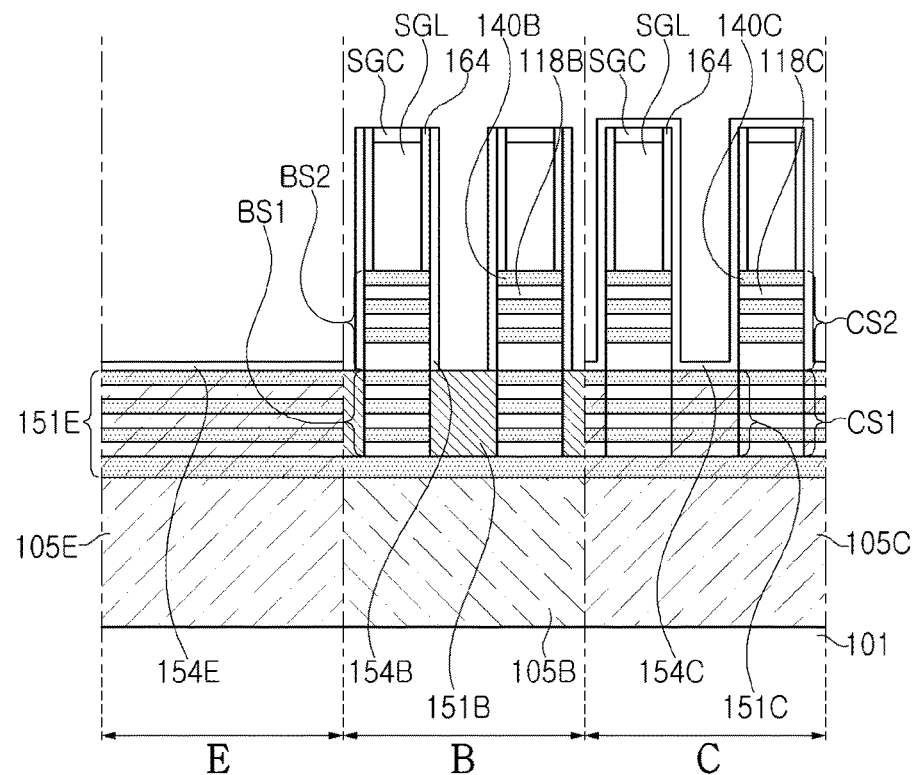

Referring to FIG. 13F, a second lower impurity region 151B may be formed in the recess portion RP.

The second lower impurity region 151B may be formed by epitaxially growing a semiconductor material including impurities in the recess portion RP. The second lower impurity region 151B may have the first-type conductivity. The second lower impurity region 151B may be formed as a single layer, or the second lower impurity region 151B may include multiple layers. The impurity concentration of the second lower impurity region 151B may be greater than that of the first lower impurity region 151E. The impurity concentration of the second lower impurity region 151B may be, e.g., in the range of about $1 \times 10^{20}$ to $5 \times 10^{20}/cm^3$.

In this process, a portion of the side surfaces of the second semiconductor layers 118B of the lower preliminary base structure BS1 exposed by the recess portion RP may be further removed. The second semiconductor layers 118B exposed by the recess portion RP may be selectively etched with respect to the first semiconductor layers 140B by, e.g., a wet etching process, and may be partially removed from the side surface taken in the X-direction. Thereafter, internal spacer layers may be formed in a region form which a portion of the side surfaces of the second semiconductor layers 118B are removed. The internal spacer layers may include SiN, SiCN, SiOCN, SiBCN, or SiBN. The internal spacer layers may be formed of the same material as that of the spacer structure 164. In another implementation, the process of removing a portion of the second semiconductor layers 118B and forming the internal spacer layers may not be performed.

In this process, the lower source/drain regions 151T may be formed by epitaxially growing a semiconductor material including impurities in the region from which the lower stack structure is removed on the second active regions 105T. The lower source/drain region 151T and the second lower impurity region 151B may have the same conductivity type.

Figure 13G:
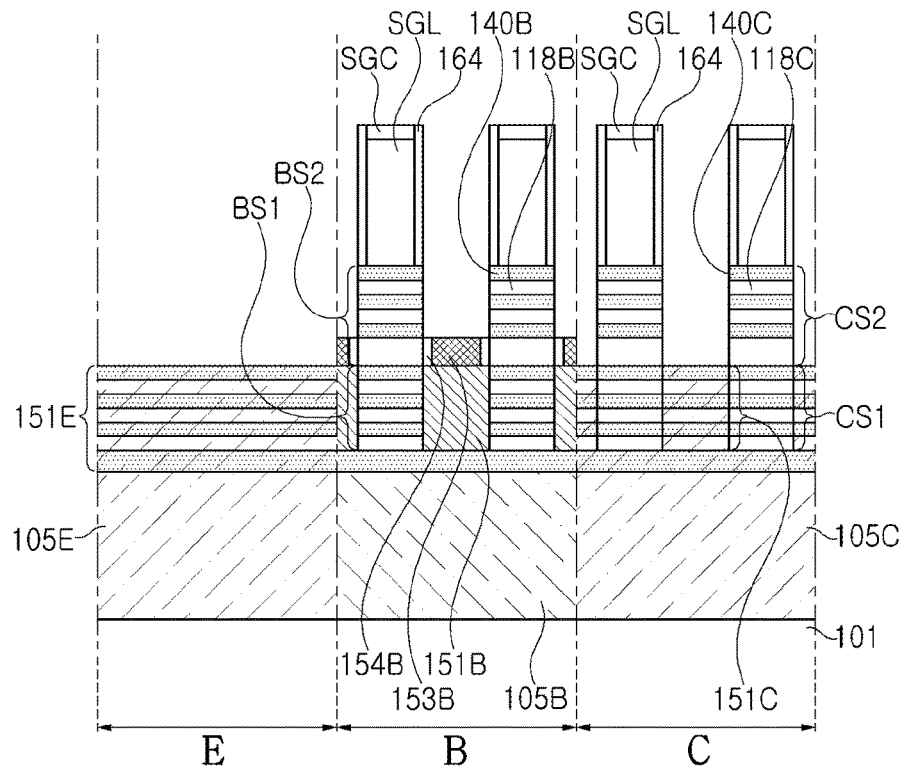

Referring to FIG. 13G, an inter-impurity region insulating layer 153B may be formed, and a portion of the liners 154E, 154B, and 154C may be removed.

The inter-impurity region insulating layer 153B may be selectively deposited on the second lower impurity region 151B. Thus, a side surface of the inter-impurity region insulating layer 153B may be in contact with the liner 154B. The inter-impurity region insulating layer 153B may include silicon nitride or silicon oxynitride.

Thereafter, an etching process to remove a portion of the liners 154E, 154B, and 154C may be performed. In the etching process, a portion of the liner 154B in contact with the inter-impurity region insulating layer 153B may remain. The remaining liner 154B and the inter-impurity region insulating layer 153B may physically and electrically isolate the second upper impurity region 152B from the second lower impurity region 151B formed through a subsequent process.

In this process, an inter-source/drain region insulating layer 153T (see FIG. 3A) may be formed on the lower stack structure, and a portion of the liner 154T (see FIG. 3A) may be removed. The inter-source/drain region insulating layer 153T may include the same material as that of the inter-impurity region insulating layer 153B.

Figure 13H:
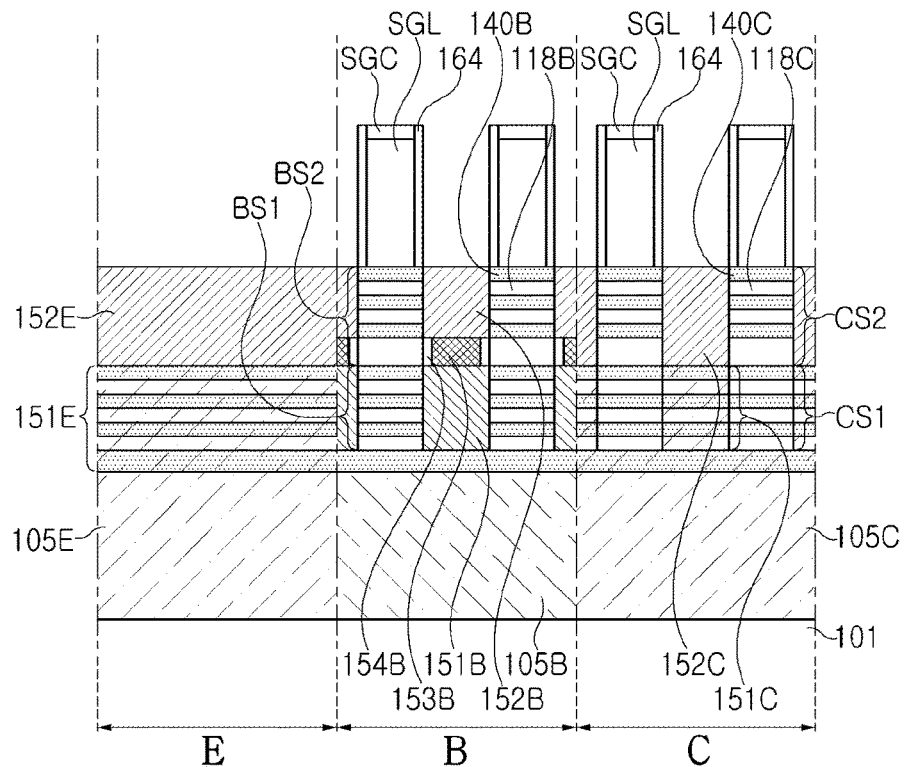

Referring to FIG. 13H, a first upper impurity region 152E, a second upper impurity region 152B, and a third upper impurity region 152C may be formed.

An epitaxial growth process may be performed using the semiconductor material including impurities having the second-type conductivity, thereby forming the first upper impurity region 152E on the first lower impurity region 151E, the second upper impurity region 152B on the second lower impurity region 151B, and the third upper impurity region 152C on the third lower impurity region 151C. The growth rate of the second upper impurity region 152B and the third upper impurity region 152C may be different from the growth rate of the first upper impurity region 152E due to the remaining upper preliminary base structure BS2 and the remaining upper preliminary collector structure CS2, but the level of the upper surfaces thereof may be formed to be substantially the same through a planarization process. Each of the first upper impurity region 152E, the second upper impurity region 152B, and the third upper impurity region 152C may be a single epitaxial layer. The impurity concentrations of the first upper impurity region 152E, the second upper impurity region 152B, and the third upper impurity region 152C may be, e.g., in the range of about $1 \times 10^{20}$ to $5 \times 10^{20}/cm^3$.

In this process, the upper source/drain region 152T (see FIG. 3A) may be formed on the inter-source/drain region insulating layer 153T and the liner 154T. The upper source/drain region 152T may be formed through the same process as the process of forming the second upper impurity region 152B. The upper source/drain region 152T and the second upper impurity region 152B may have the same conductivity type.

Figure 13I:
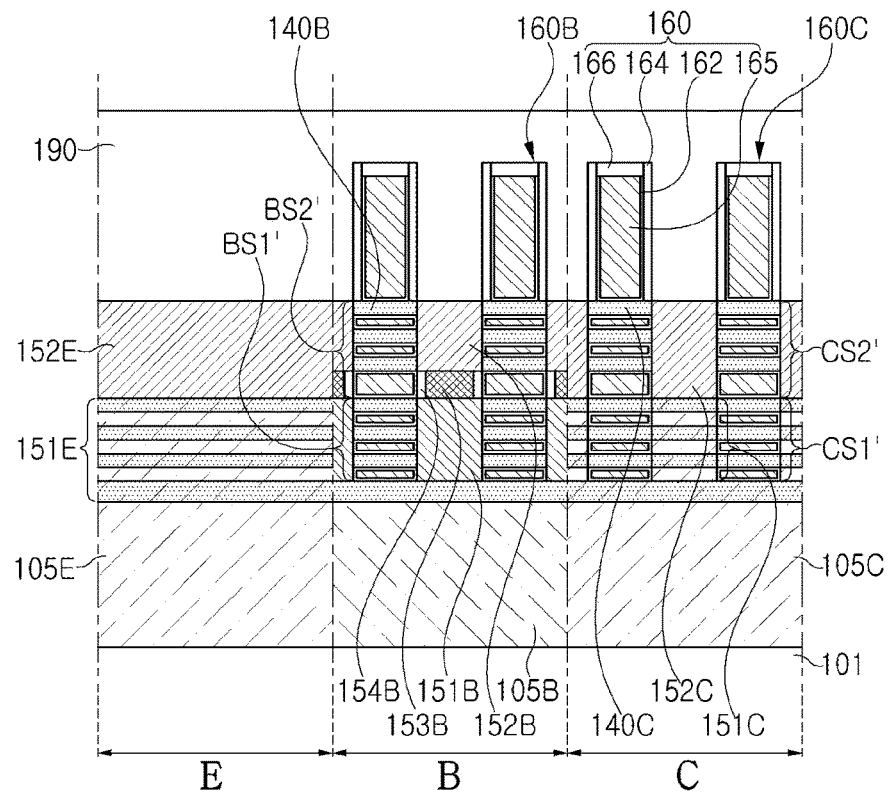

Referring to FIG. 13I, at least a portion of the sacrificial gate structures SGC and SGL and the second semiconductor layers 118E, 118B, and 118C may be removed, thereby forming the gate structures 160B and 160C.

The second semiconductor layers 118E, 118B, and 118C and the sacrificial gate structures SGC and SGL may be selectively removed with respect to the spacer structure 164 and the first semiconductor layers 140E, 140B, and 140C. First, upper gap regions may be formed by removing the sacrificial gate structures SGC and SGL, and lower gap regions may be formed by removing the second semiconductor layers 118E, 118B, and 118C exposed through the upper gap regions. For example, when the second semiconductor layers 118E, 118B, and 118C include silicon germanium (SiGe) and the first semiconductor layers 140E, 140B, and 140C include silicon (Si), the second semiconductor layers 118E, 118B, and 118C may be selectively removed by performing a wet etching process using peracetic acid as an etchant.

Thereafter, a gate dielectric layer 162 and a gate electrode 165 may be formed, in order, in the upper gap region and the lower gap region. The gate dielectric layer 162 may be formed to conformally cover internal surfaces of the upper gap regions and the lower gap regions. The gate electrode 165 may be formed by completely filling the upper gap regions and the lower gap regions.

Thereafter, the level of the upper surface may be lowered by partially etching the upper portion of the gate electrode 165 and upper portion of the spacer structure 164 by a predetermined depth, an insulating material may be filled in the space formed as the level of the upper surface is lowered, a planarization process may be performed, thereby form a capping layer 166. The capping layer 166 may be formed of silicon nitride or a silicon nitride-based insulating material.

In this process, the sacrificial gate structures SGC and SGL and the second semiconductor layers on the second active regions 105T may be removed, and the gate structures 160T may be formed.

In an example embodiment, differently from the gate structures 160T on the second active regions 105T, the gate structures 160B and 160C on the first active regions 105E, 105B, 105C may be dummy gate structures.

Thereafter, an interlayer insulating layer 190 covering the gate structures 160T and the source/drain regions 150T, the first upper impurity region 152E, the second upper impurity region 152B, and the third upper impurity region 152C may be formed.

Figure 13J:
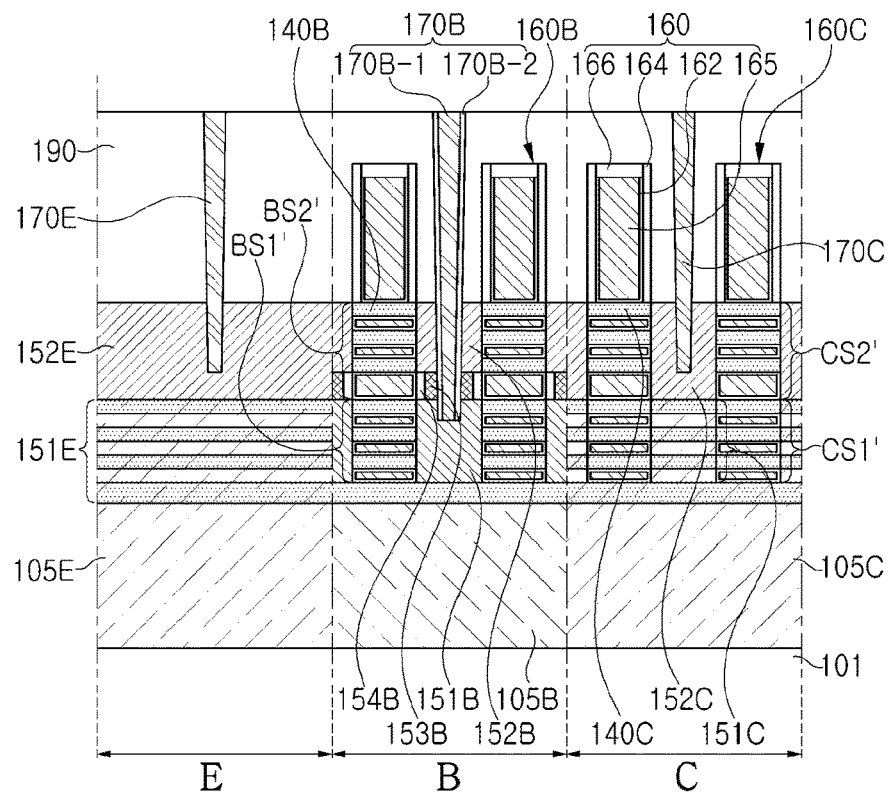

Referring to FIG. 13J, first contact plugs 170E, 170B, and 170C may be formed.

A contact hole penetrating through the interlayer insulating layer 190 may be formed on the first active regions 105E, 105B, and 105C, the contact hole may be filled with a conductive material, a planarization process may be performed, thereby forming the first contact plugs 170E, 170B, and 170C.

The emitter contact plug 170E may be in contact with the first upper impurity region 152E. The base contact plug 170B may be in contact with the second lower impurity region 151B. The collector contact plug 170C may be in contact with the third upper impurity region 152C. In another implementation, portions connected to the first contact plugs 170E, 170B, and 170C may be varied.

For the base contact plug 170B, a sidewall insulating layer 170B-2 may be formed on a side surface of the contact hole, and a plug layer 170B-1 covering the sidewall insulating layer 170B-2 and the second lower impurity region 151B may be formed. Thus, the plug layer 170B-1 may be spaced apart from the second upper impurity region 152B, and may be electrically isolated from the second upper impurity region 152B.

In this process, the second contact plugs 170T (see FIG. 1B) may be formed together. The lower contact plug 171T (see FIG. 3C) of the second contact plugs 170T may be formed to include a plug layer 171T-1 and a sidewall insulating layer 171T-2, similarly to the base contact plug 170B. The upper contact plug 172T (see FIG. 3A) of the second contact plugs 170T may be formed to include only a plug layer. Among the second contact plugs 170T, the common contact plug 173T (see FIG. 3B) may be formed to include only a plug layer.

Figure 14A:
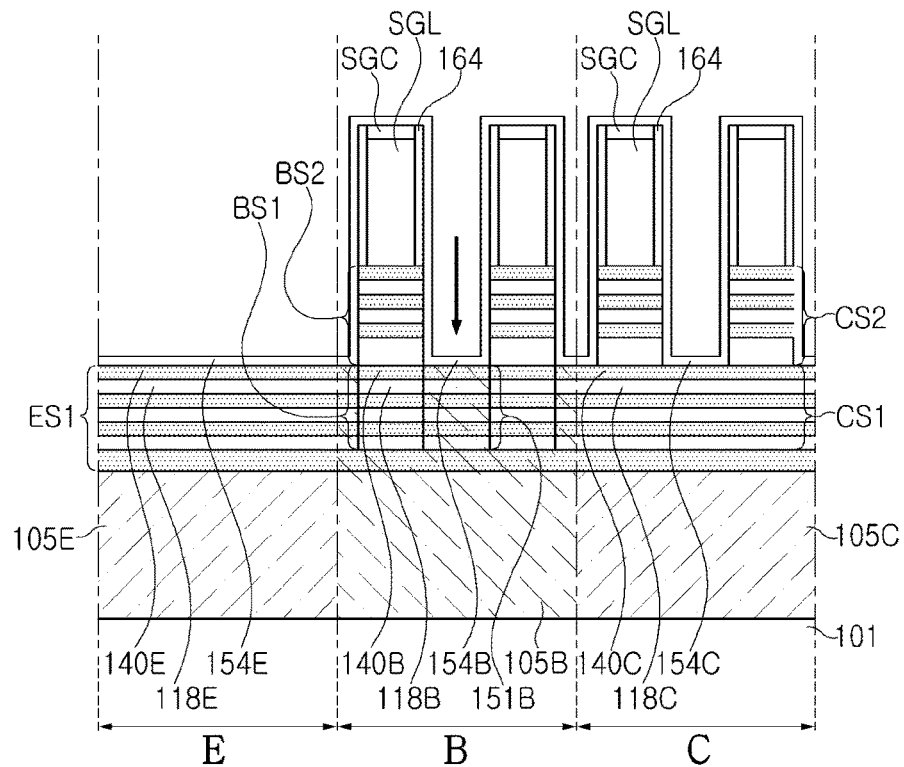
FIGS. 14A to 14H are diagrams illustrating processes of a method of manufacturing a semiconductor device in order according to an example embodiment.

FIGS. 14A to 14H are diagrams illustrating processes of a method of manufacturing a semiconductor device 200 in order according to an example embodiment. FIGS. 14A to 13H are enlarged cross-sectional diagrams illustrating the first structure E, the second structure B, and the third structure C in order to describe a method of manufacturing the first device DV1 in FIG. 9A. The second device DV2 in FIG. 9B may have a structure the same as or similar to the second structure B, and may be understood with reference to the description of the method of manufacturing the second structure B and the example described with reference to FIGS. 13A to 13J, and thus, the description thereof will not be provided.

Referring to FIG. 14A, the same processes described with reference to FIGS. 13A to 13C may be performed, and a second lower impurity region 151B may be formed.

The second lower impurity region 151B may be formed by doping a portion of the lower preliminary base structure BS1 with impurities through an ion implantation process. The sacrificial gate structures SGC and SGL may be on the lower preliminary base structure BS1, and the second lower impurity region 151B may be formed by doping, with impurities, only the regions in which the sacrificial gate structures SGC and SGL are not disposed. The impurity concentration of the second lower impurity region 151B may be, e.g., in the range of about $1\times10^{19}$ to $5\times10^{19}/cm^3$. The conductivity of the impurity may be first-type conductivity.

Figure 14B:
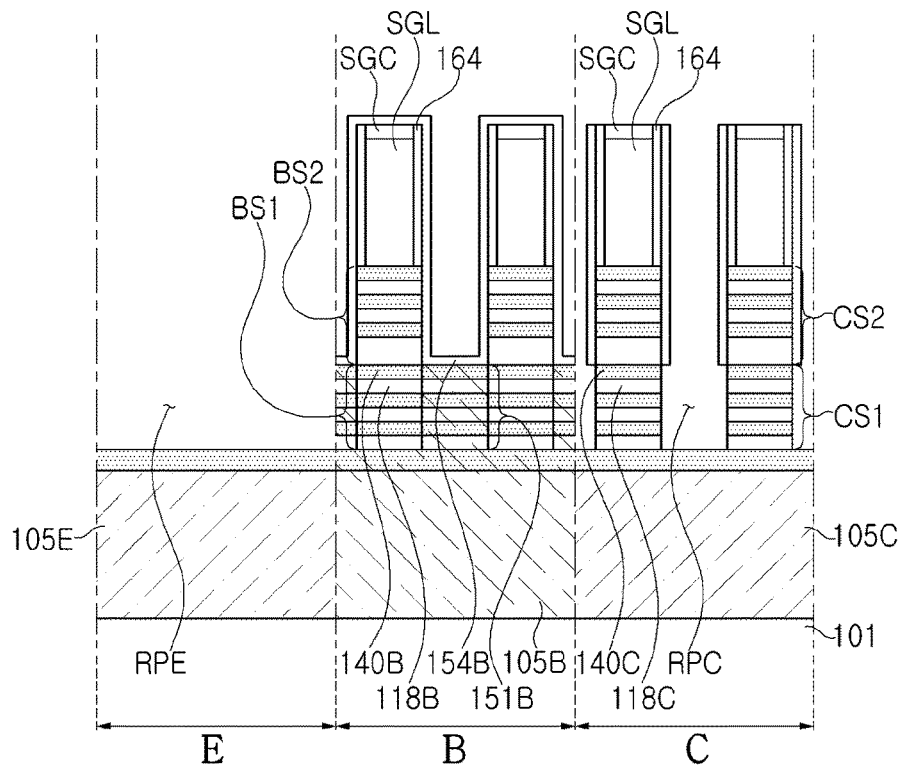

Referring to FIG. 14B, recess portions RPE and RPC may be formed by removing at least a portion of the lower preliminary emitter structure ES1 and the lower preliminary collector structure CS1.

The sacrificial gate structures SGC and SGL may not be formed on the lower preliminary emitter structure ES1, and the recess portion RPE may be formed by entirely removing the lower preliminary emitter structure ES1 through an etching process.

The sacrificial gate structures SGC and SGL and the spacer structure 164 may be formed on the lower preliminary collector structure CS1, and the region in which the sacrificial gate structures SGC and SGL and the spacer structure 164 are not disposed may be removed through an etching process. During the etching process, the sacrificial gate structures SGC and SGL and the upper preliminary collector structure CS2 may be protected from etching by the liner 154C. Thereafter, the recess portion RPC may be formed by additionally etching the lower preliminary collector structure CS1 below the liner 154C. Thus, the remaining lower preliminary collector structure CS1 and the remaining upper preliminary collector structure CS2 may have substantially the same width in one direction, e.g., the X-direction. In another implementation, the additional etching process may not be performed.

Figure 14C:
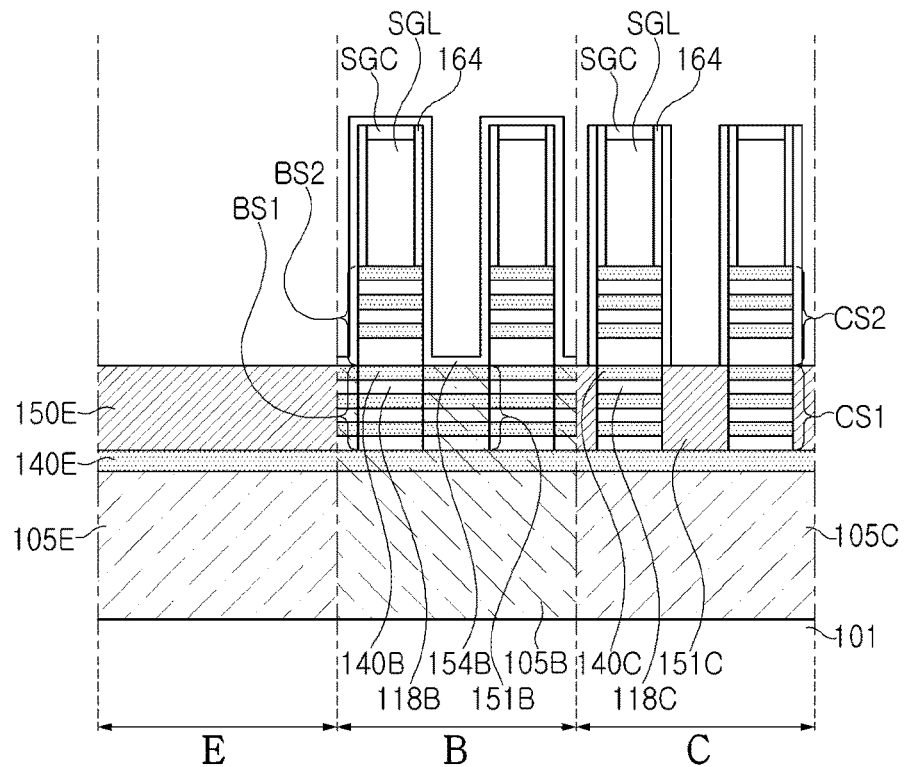

Referring to FIG. 14C, a first impurity region 150E and a third lower impurity region 151C may be formed.

The first impurity region 150E and the third lower impurity region 151C may be formed by epitaxially growing a semiconductor material including impurities in the recess portions RPE and RPC. Each of the first impurity region 150E and the third lower impurity region 151C may have second-type conductivity different from the first-type conductivity. Each of the first impurity region 150E and the third lower impurity region 151C may be formed as a single layer. The impurity concentration of each of the first impurity region 150E and the third lower impurity region 151C may be greater than the impurity concentration of the second lower impurity region 151B. The impurity concentration of each of the first lower impurity region 151E and the third lower impurity region 151C may be, e.g., in the range of about $1\times10^{20}$ to $5\times10^{20}/cm^3$.

Figure 14D:
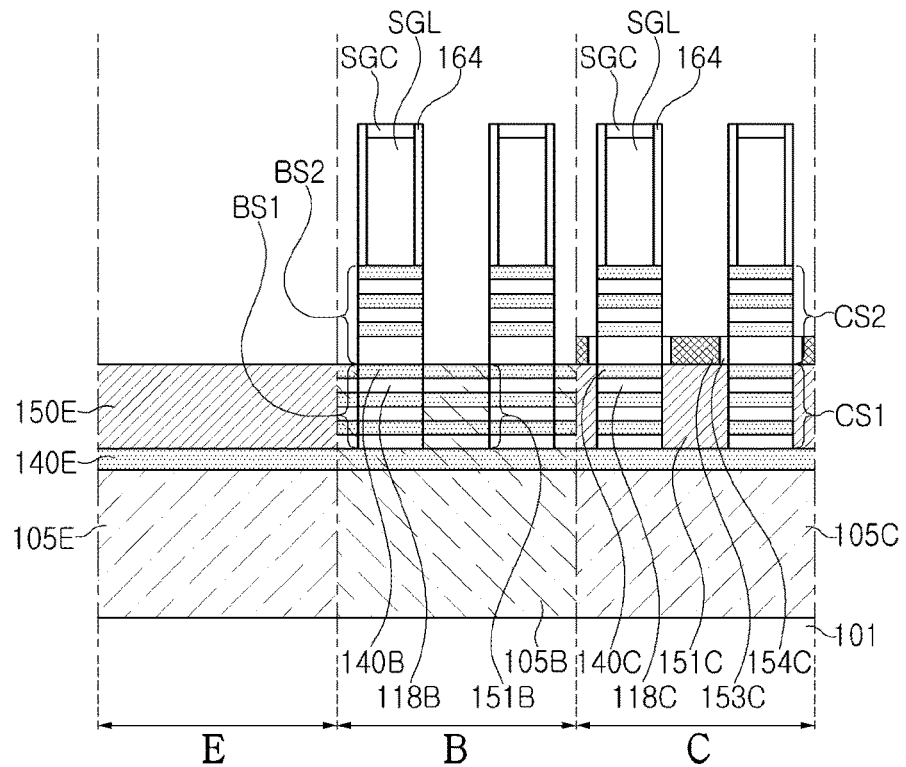

Referring to FIG. 14D, an inter-impurity region insulating layer 153C may be formed, and portions of the liners 154E, 154B, and 154C may be removed.

The inter-impurity region insulating layer 153B may be selectively deposited on the first impurity region 150E and the third lower impurity region 151C. In an example embodiment, an inter-impurity region insulating layer on the first impurity region 150E may be formed together, and may be removed through an additional process. In another implementation, the inter-impurity region insulating layer on the first impurity region 150E may not be removed. A side surface of the inter-impurity region insulating layer 153C on the third lower impurity region 151C may be in contact with the liner 154C. The inter-impurity region insulating layer 153C may include silicon nitride or silicon oxynitride.

Thereafter, an etching process for removing the liners 154E, 154B, and 154C may be performed. In the etching process, a portion of the liner 154C in contact with the inter-impurity region insulating layer 153C may remain. The remaining liner 154C and the remaining inter-impurity region insulating layer 153C may physically and electrically separate the third upper impurity region 152C from the third lower impurity region 151C formed through a subsequent process.

Figure 14E:
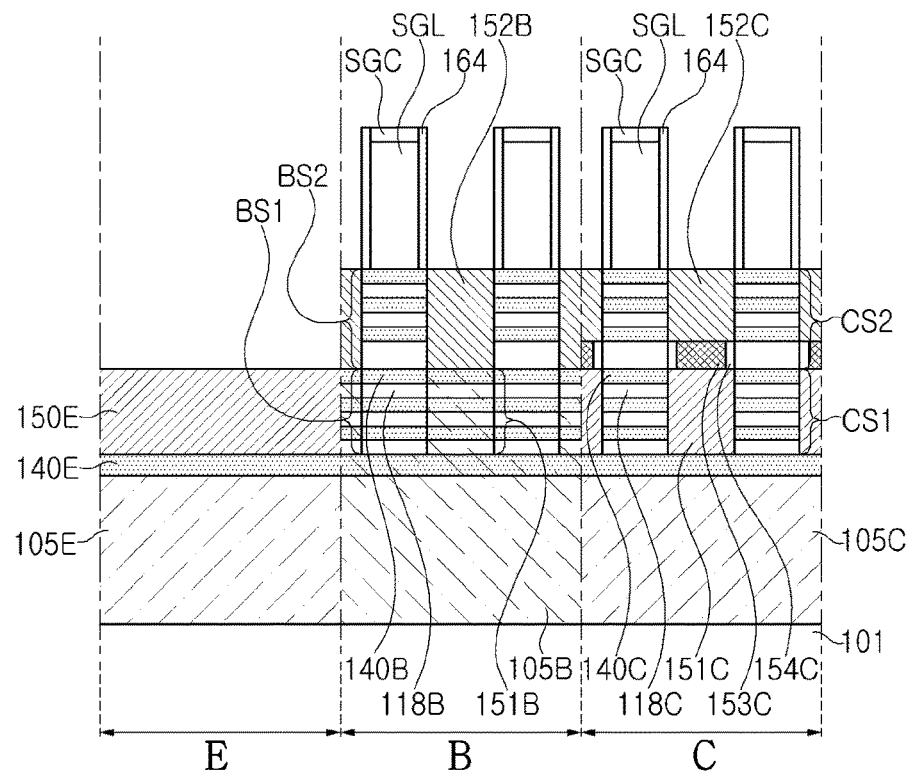

Referring to FIG. 14E, a second upper impurity region 152B and a third upper impurity region 152C may be formed.

The second upper impurity region 152B on the second lower impurity region 151B and the third upper impurity region 152C on the third lower impurity region 151C may be formed by performing an epitaxial growth process using a semiconductor material including impurities having the first-type conductivity. Each of the second upper impurity region 152B and the third upper impurity region 152C may be a single epitaxial layer. The impurity concentrations of the second upper impurity region 152B and the third upper impurity region 152C may be, e.g., in the range of about $1 \times 10^{20}$ to $5 \therefore 10^{20}/cm^3$.

In this process, portions of side surfaces of the second semiconductor layers 118B and 118C of the exposed upper preliminary base structure BS2 and the upper preliminary collector structure CS2 may be further removed. The second semiconductor layers 118B and 118C may be selectively etched with respect to the first semiconductor layers 140B and 140C by, e.g., a wet etching process and may be partially removed from the side surface taken in the X-direction. Thereafter, internal spacer layers may be formed in a region from which a portion of the side surfaces of the second semiconductor layers 118B and 118C is removed. The internal spacer layers may include SiN, SiCN, SiOCN, SiBCN, or SiBN. The internal spacer layers may be formed of the same material as that of the spacer structure 164. In another implementation, the process of removing a portion of the second semiconductor layers 118B and forming the internal spacer layers may not be performed.

Figure 14F:
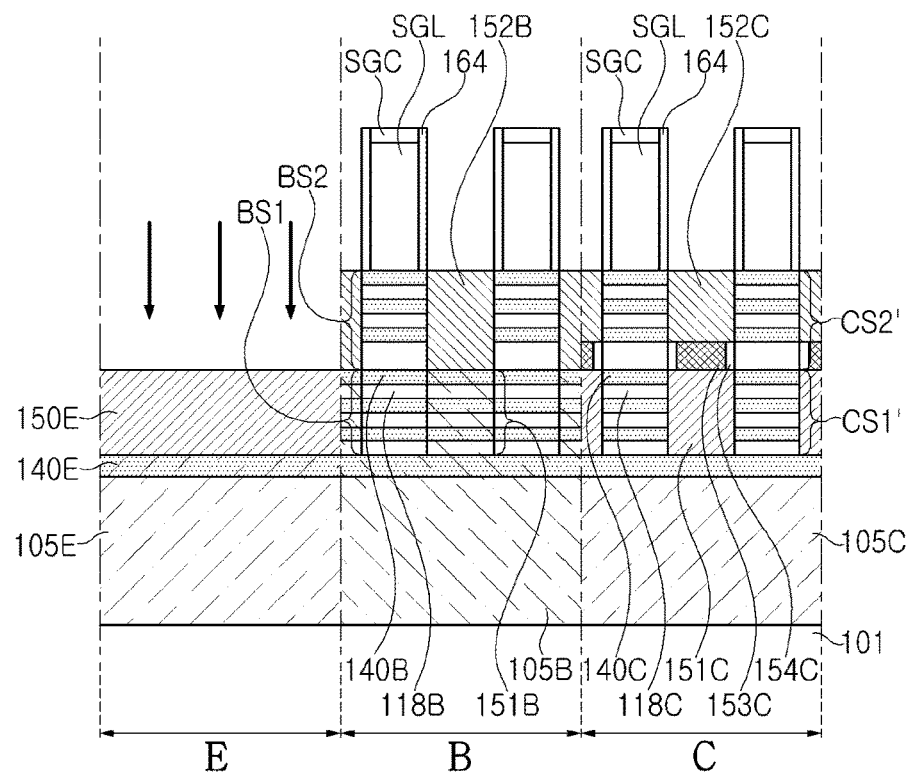

Referring to FIG. 14F, impurities may be doped to the first semiconductor layer 140E below the first impurity region 150E and the upper emitter active region 105E2 of the emitter active region 105E in contact with the first semiconductor layer 140E. The impurities may include the second-type conductivity. The first semiconductor layer 140E may not be provided, and an upper end of the emitter active region 105E in contact with the first impurity region 150E may be doped. The first impurity region 150E may be referred to as the first upper impurity region. The upper end of the first semiconductor layer 140E and the upper emitter active region 105E2 of the emitter active region 105E may be referred to as the first lower impurity region. An impurity concentration of the first upper impurity region may be higher than an impurity concentration of the first lower impurity region.

Figure 14G:
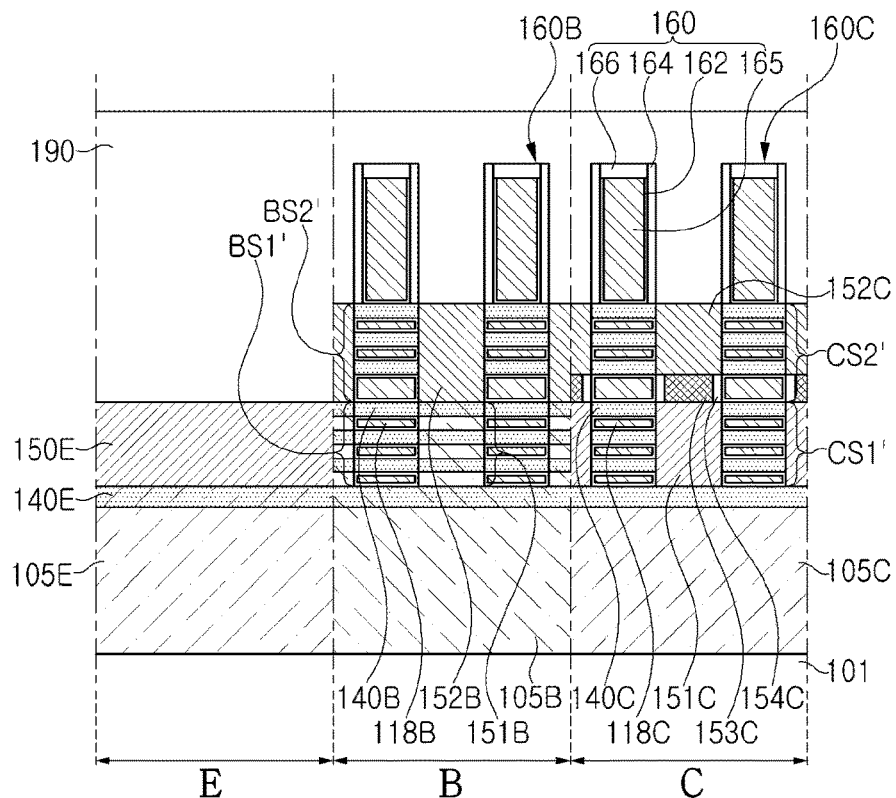

Referring to FIG. 14G, the sacrificial gate structures SGC and SGL and the second semiconductor layers 118E, 118B, and 118C may be removed, and the gate structure 160 may be formed.

The second semiconductor layers 118E, 118B, and 118C and the sacrificial gate structures SGC and SGL may be selectively removed with respect to the spacer structure 164 and the first semiconductor layers 140E, 140B, and 140C. First, upper gap regions may be formed by removing the sacrificial gate structures SGC and SGL, and lower gap regions may be formed by removing the second semiconductor layers 118E, 118B, and 118C exposed through the upper gap regions.

Thereafter, a gate dielectric layer 162 and a gate electrode 165 may be formed, in order, in the upper gap region and the lower gap region. The gate dielectric layer 162 may be formed to conformally cover internal surfaces of the upper gap regions and the lower gap regions. The gate electrode 165 may be formed by completely filling the upper gap regions and the lower gap regions.

Thereafter, the level of the upper surface may be lowered by partially etching the upper portion of the gate electrode 165 and upper portion of the spacer structure 164 by a predetermined depth, an insulating material may be filled in the space formed as the level of the upper surface is lowered, and a planarization process may be performed, thereby forming a capping layer 166.

Figure 14H:
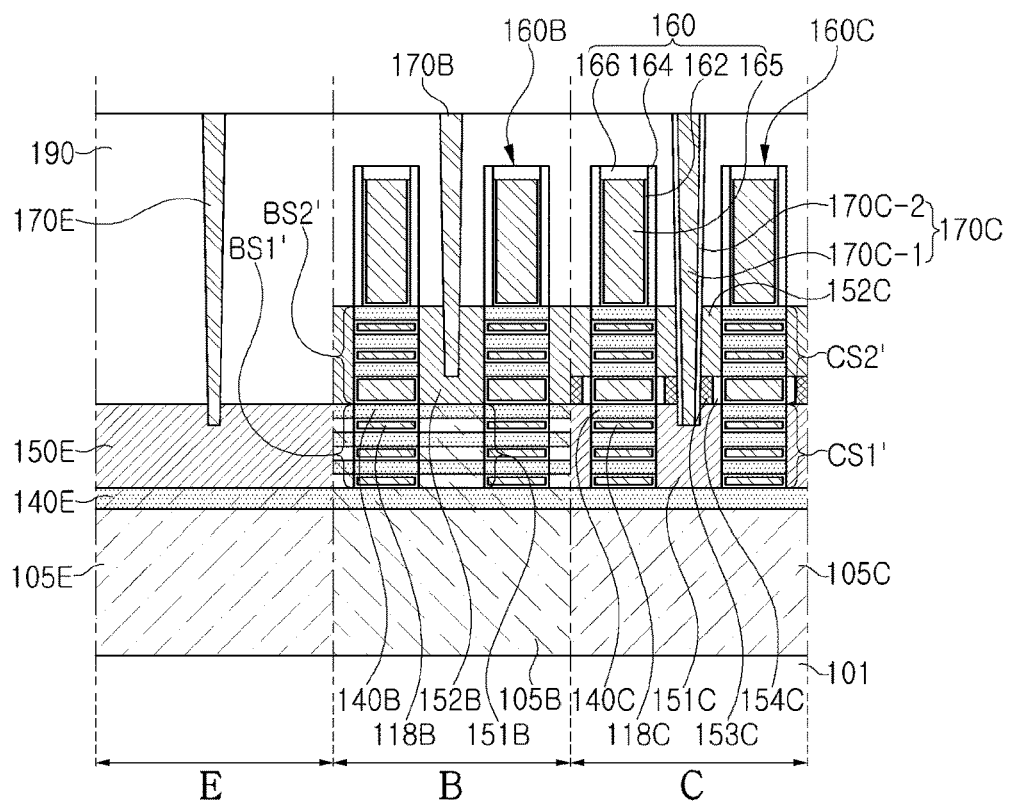

Referring to FIG. 14H, first contact plugs 170E, 170B, and 170C may be formed.

A contact hole penetrating through the interlayer insulating layer 190 may be formed on the first active regions 105E, 105B, and 105C, the contact hole may be filled with a conductive material, and a planarization process may be performed, thereby forming the first contact plugs. 170E, 170B, and 170C.

The emitter contact plug 170E may be in contact with the first impurity region 150E. The base contact plug 170B may be in contact with the second upper impurity region 152B. The collector contact plug 170C may be in contact with the third lower impurity region 151C. In another implementation, portions connected to the first contact plugs 170E, 170B, and 170C may be varied.

For the collector contact plug 170C, a sidewall insulating layer 170C-2 may be formed on a side surface of the contact hole, and a plug layer 170C-1 may be formed to cover the sidewall insulating layer 170C-2 and the exposed third lower impurity region 151C. Thus, the plug layer 170C-1 may be spaced apart from the third upper impurity region 152C, and may be electrically isolated from the third upper impurity region 152C.

According to the aforementioned example embodiments, by including a vertical PNP device using upper and lower source/drain regions of the stacked transistor, a semiconductor device having an improved production yield and electrical performance may be provided.

Embodiments may provide a semiconductor device having an improved production yield and electrical performance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Thus, it will be understood by those of skill in the art that various changes in form and details may be made without departing from the spirit and scope of the present invention as set forth in the following claims.

What is claimed is:

1. A semiconductor device, comprising:
   a first device including first active regions spaced apart from each other on a substrate, and a first structure, a second structure, and a third structure on each of the first active regions; and
   a second device including a second active region spaced apart from the first active regions on the substrate and extending in a first direction parallel to an upper surface of the substrate, at least one gate structure intersecting the second active region and extending in a second direction, a source/drain region including a lower source/drain region on the second active region on at least one side of the gate structure and having first-type conductivity, an inter-source/drain region insulating layer on the lower source/drain region, and an upper source/drain region on the inter-source/drain region insulating layer and having second-type conductivity different from the first-type conductivity, wherein:
the first structure includes a first lower impurity region and a first upper impurity region on the first lower impurity region,
the second structure includes a second lower impurity region having the first-type conductivity, an inter-impurity region insulating layer on the second lower impurity region, and a second upper impurity region on the inter-impurity region insulating layer and having the second-type conductivity, and
the third structure includes a third lower impurity region having the second-type conductivity and a third upper impurity region on the third lower impurity region having the second-type conductivity and having an impurity concentration higher than an impurity concentration of the third lower impurity region.

2. The semiconductor device as claimed in claim 1, wherein:
the impurity concentration of the third lower impurity region is in a range of about $1\times10^{19}/cm^3$ to $5\times10^{19}/cm^3$, and
the impurity concentration of the third upper impurity region is in a range of about $1\times10^{20}/cm^3$ to $5\times10^{20}/cm^3$.

3. The semiconductor device as claimed in claim 1, wherein the inter-impurity region insulating layer electrically separates the second lower impurity region from the second upper impurity region.

4. The semiconductor device as claimed in claim 1, wherein:
the second lower impurity region is spaced apart from the second upper impurity region, and
the third lower impurity region is in contact with the third upper impurity region.

5. The semiconductor device as claimed in claim 1, wherein the inter-impurity region insulating layer includes a same material as a material of the inter-source/drain region insulating layer.

6. The semiconductor device as claimed in claim 1, wherein:
each of the first lower impurity region and the first upper impurity region has the second-type conductivity,
the first lower impurity region includes a stack structure of first semiconductor layers and second semiconductor layers alternately stacked,
the first semiconductor layers are first material layers,
the second semiconductor layers are second material layers different from the first material layers,
the first upper impurity region includes a third semiconductor layer configured as a third material layer,
the third material layer is different from at least one of the first and second material layers, and
a thickness of the third material layer is greater than a thickness of each of the first and second material layers.

7. The semiconductor device as claimed in claim 1, wherein:
an impurity concentration of the first lower impurity region is lower than an impurity concentration of the first upper impurity region, and
the first lower impurity region is on substantially the same level as a level of the lower source/drain region.

8. The semiconductor device as claimed in claim 1, wherein:
the third lower impurity region includes a stack structure of first semiconductor layers and second semiconductor layers alternately stacked,
the third upper impurity region includes a third semiconductor layer,
the third semiconductor layer includes a material different from a material of at least one of the first semiconductor layers and the second semiconductor layers, and
a thickness of the third semiconductor layer is greater than a thickness of each of the first and second semiconductor layers.

9. The semiconductor device as claimed in claim 1, further comprising:
an emitter contact plug in contact with the first upper impurity region;
a base contact plug in contact with the second lower impurity region; and
a collector contact plug in contact with the third upper impurity region.

10. The semiconductor device as claimed in claim 9, wherein:
the base contact plug includes a plug layer and a sidewall insulating layer covering a side surface of the plug layer,
the plug layer is spaced apart from the second upper impurity region, and
the base contact plug penetrates the second upper impurity region, and is in contact with the second lower impurity region.

11. The semiconductor device as claimed in claim 9, wherein the base contact plug includes:
a horizontal contact plug connected to at least a portion of a side surface of the second lower impurity region; and
a vertical contact plug not in contact with the second upper impurity region, and connected to the horizontal contact plug.

12. The semiconductor device as claimed in claim 1, further comprising dummy gate structures on upper surfaces of each of the second and third structures, respectively, the dummy gate structures extending and being spaced apart from the gate structure,
wherein the dummy gate structures are not on the first structure.

13. A semiconductor device, comprising:
a first device including a first structure, a second structure, and a third structure spaced apart from each other on a substrate;
a second device including an active region extending in a first direction parallel to an upper surface of the substrate, at least one gate structure intersecting the active region and extending in a second direction, a source/drain region including a lower source/drain region on the active region on at least one side of the gate structure and having first-type conductivity, an inter-source/drain region insulating layer on the lower source/drain region, and an upper source/drain region on the inter-source/drain region insulating layer and having second-type conductivity different from the first-type conductivity, wherein:
the first structure includes a first lower impurity region having the second-type conductivity, and a first upper impurity region on the first lower impurity region having the second-type conductivity and having an impurity concentration higher than an impurity concentration of the first lower impurity region, the second structure includes a second lower impurity region having the first-type conductivity, an inter-impurity region insulating layer on the second lower impurity region, and a second upper impurity region on the inter-impurity region insulating layer and having the second-type conductivity, and the third structure includes a third lower impurity region having the second-type conductivity, and a third upper impurity region on the third lower impurity region and having the second-type conductivity.

14. The semiconductor device as claimed in claim 13, further comprising:
   an emitter contact plug in contact with at least one of the first upper and lower impurity regions;
   a base contact plug in contact with the second lower impurity region; and
   a collector contact plug in contact with at least one of the third upper and lower impurity regions.

15. The semiconductor device as claimed in claim 13, wherein:
   the second device includes a plurality of channel layers spaced apart from each other in a direction perpendicular to the upper surface of the substrate on the active region, and in contact with the source/drain region on at least one side, and
   the second structure includes dummy channel layers on the same level as a level of the plurality of channel layers, and in contact with at least one side of the second lower impurity region, the inter-impurity region insulating layer, and the second upper impurity region.

16. A semiconductor device, comprising:
   a first device including a first structure, a second structure, and a third structure spaced apart from each other on a substrate;
   a second device including an active region extending in a first direction parallel to an upper surface of the substrate, at least one gate structure intersecting the active region and extending in a second direction, a source/drain region including a lower source/drain region on the active region on at least one side of the gate structure and having first-type conductivity, an inter-source/drain region insulating layer on the lower source/drain region, and an upper source/drain region on the inter-source/drain region insulating layer and having second-type conductivity different from the first-type conductivity, wherein:
   the first structure includes a first lower impurity region having the first-type conductivity, and a first upper impurity region on the first lower impurity region and having the first-type conductivity,
   the second structure includes a second lower impurity region having a stack structure of first and second semiconductor layers alternately stacked and having the second-type conductivity, and a second upper impurity region including a third semiconductor layer on the second lower impurity region and having the second-type conductivity,
   the first semiconductor layers are first material layers,
   the second semiconductor layers are second material layers different from the first material layers,
   the third semiconductor layer is a third material layer different from at least one of the first and second material layers,
   a thickness of the third material layer is greater than a thickness of each of the first and second material layers, and
   the third structure includes a third lower impurity region having the first-type conductivity, an inter-impurity region insulating layer on the third lower impurity region, and a third upper impurity region on the inter-impurity region insulating layer and having the second-type conductivity.

17. The semiconductor device as claimed in claim 16, further comprising:
   an emitter contact plug in contact with at least one of the first upper and lower impurity regions;
   a base contact plug in contact with at least one of the second upper and lower impurity regions; and
   a collector contact plug in contact with the third lower impurity region.

18. The semiconductor device as claimed in claim 16, wherein an impurity concentration of the first upper impurity region is higher than an impurity concentration of the first lower impurity region.

19. The semiconductor device as claimed in claim 16, wherein an impurity concentration of the second lower impurity region is lower than an impurity concentration of the second upper impurity region.

20. The semiconductor device as claimed in claim 16, wherein:
   the third lower impurity region is electrically isolated from the third upper impurity region, and
   the second lower impurity region is electrically connected to the second upper impurity region.

* * * * *